United States Patent [19]
Iwamoto et al.

[11] Patent Number: 5,764,590
[45] Date of Patent: Jun. 9, 1998

[54] SYNCHRONOUS SEMICONDUCTOR MEMORY DEVICE WHICH ALLOWS SWITCHING OF BIT CONFIGURATION

[75] Inventors: Hisashi Iwamoto; Yasuhiro Konishi, both of Hyogo, Japan

[73] Assignee: Mitsubishi Denki Kabushiki Kaisha, Tokyo, Japan

[21] Appl. No.: 735,149

[22] Filed: Oct. 22, 1996

[30] Foreign Application Priority Data

Feb. 15, 1996 [JP] Japan .................. 8-027854

[51] Int. Cl.$^6$ ...................... G11C 8/00
[52] U.S. Cl. .......... 365/233; 365/230.03; 365/219; 365/221; 365/189.05; 365/51
[58] Field of Search ............... 365/233, 230.03, 365/219, 221, 189.05, 51

[56] References Cited

U.S. PATENT DOCUMENTS 5,596,541  1/1997  Toda ................ 365/230.03

FOREIGN PATENT DOCUMENTS 7-169263  7/1995  Japan .

OTHER PUBLICATIONS

Y. Takai, et al. "250Mbyte/sec Synchronous DRAM Using a 3-Stage-Pipelined Architecture," 1993 Symposium on VLSI Circuit, pp. 59–60.

Yunho Choi, et al. "16Mbit Synchronous DRAM with 125Mbyte/sec Data Rate," 1993 Symposium on VLSI Circuit, pp. 65–66.

Primary Examiner—David C. Nelms
Assistant Examiner—Andrew Q. Tran
Attorney, Agent, or Firm—Lowe, Price, LeBlanc & Becker

[57] ABSTRACT

A synchronous DRAM includes a selector which supplies 2 bits of serial data signals from one data input/output terminal to two input/output line pairs as parallel data signals in x8 configuration mode, and supplies 2 bits of parallel data signals from both data input/output terminals directly to two input/output line pairs in x16 configuration mode. Therefore, the synchronous DRAM allows switching of bit configuration, and it takes 2-bits prefetch configuration in x8 configuration mode, and signal pipeline configuration in x16 configuration mode.

8 Claims, 17 Drawing Sheets

FIG. 1
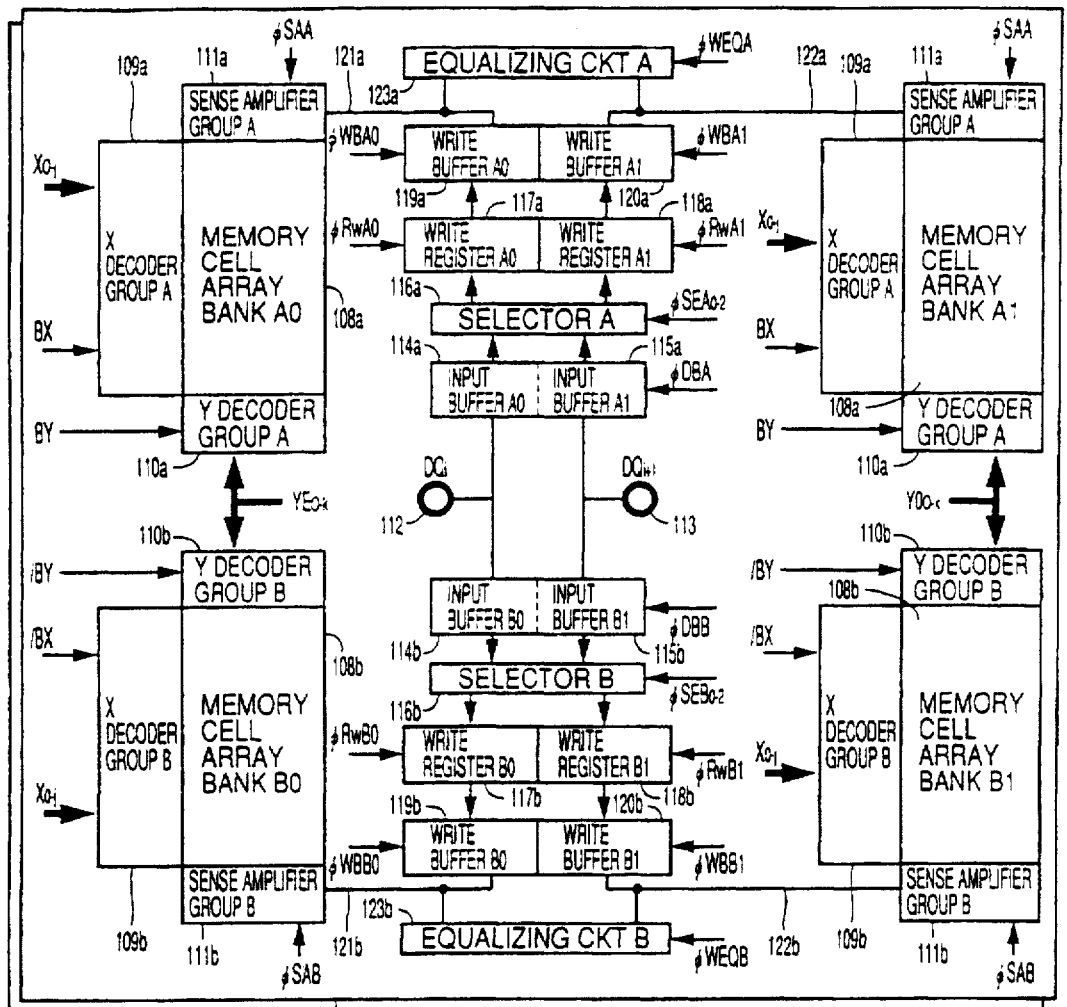
FIG. 1A
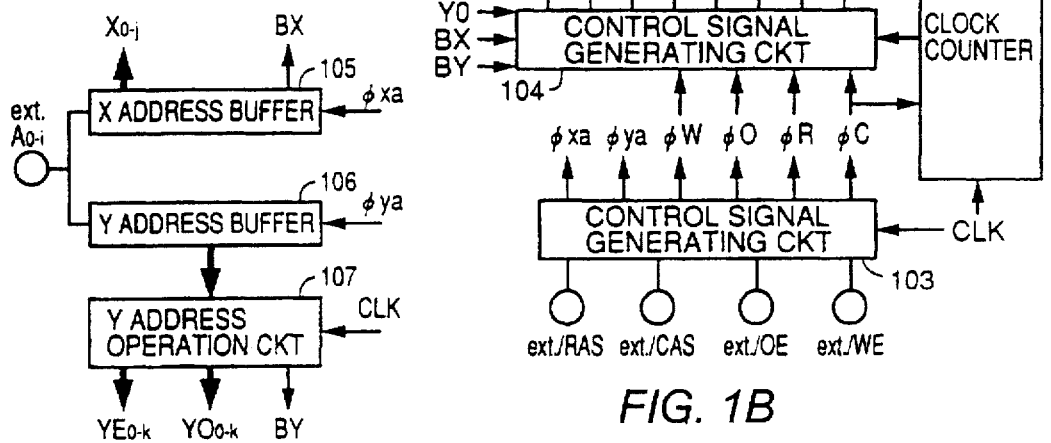
FIG. 1B

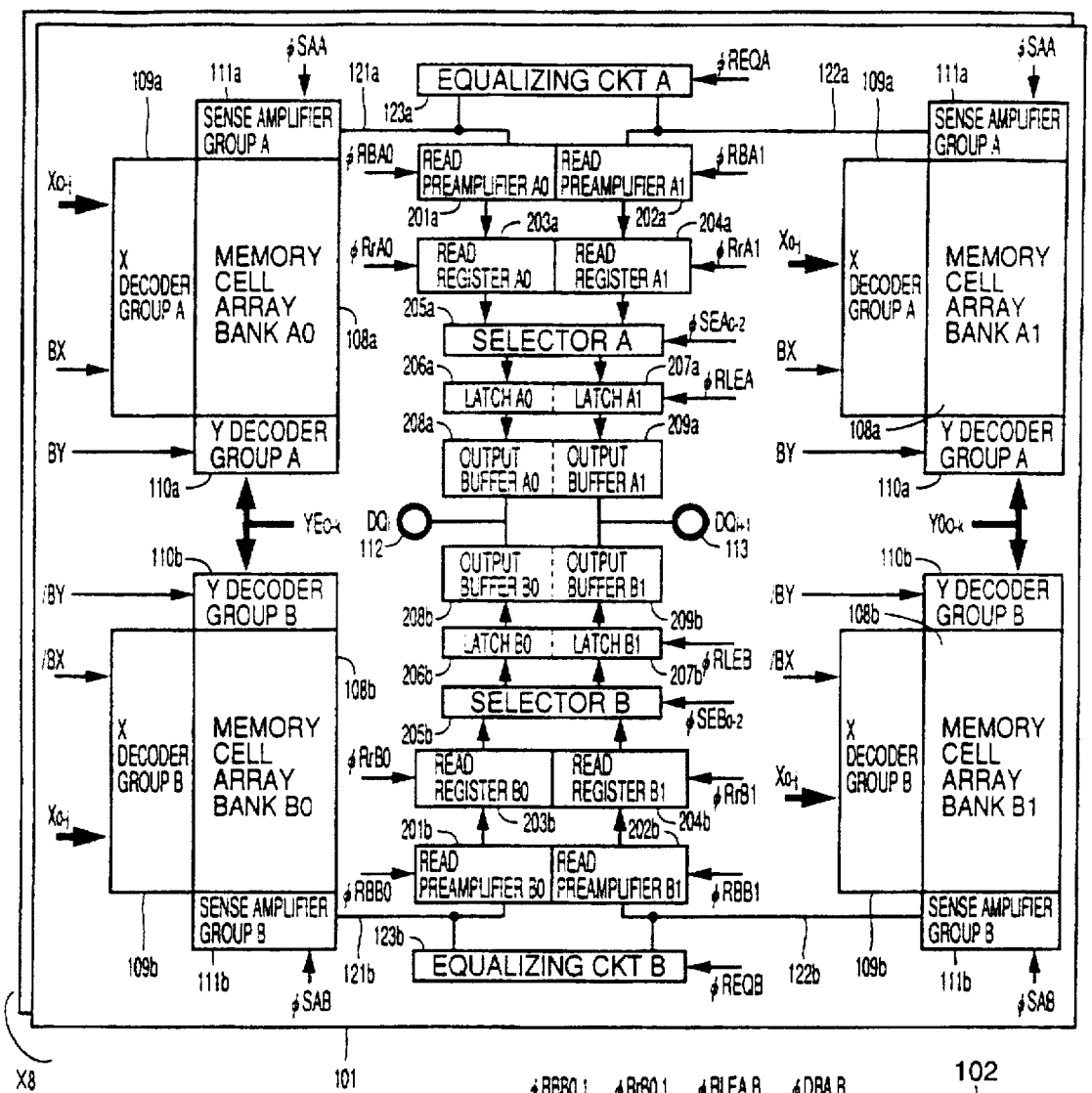
FIG. 2
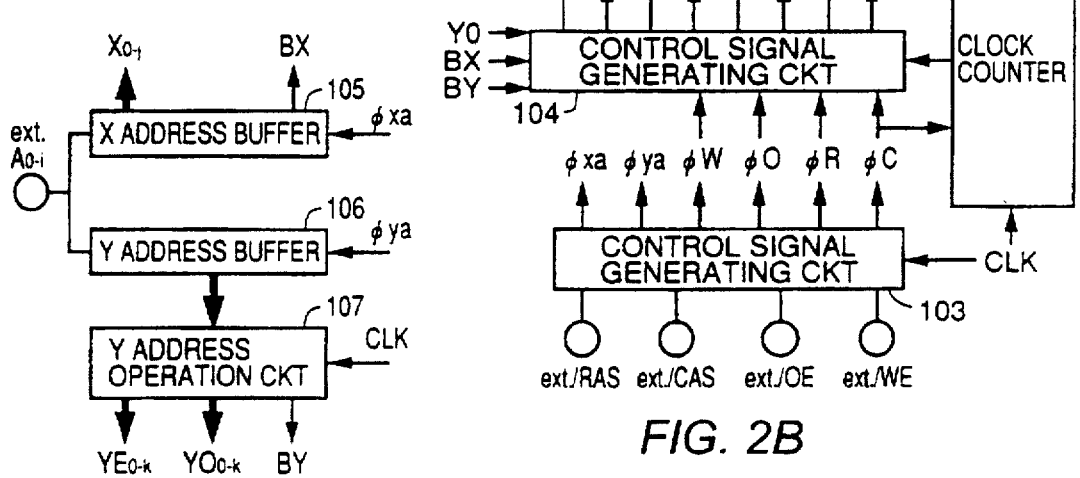
FIG. 2A
FIG. 2B

X8 CONFIGURATION (2 BITS PREFETCH)

FIG.8 X16 CONFIGURATION (SINGLE PIPE LINE)

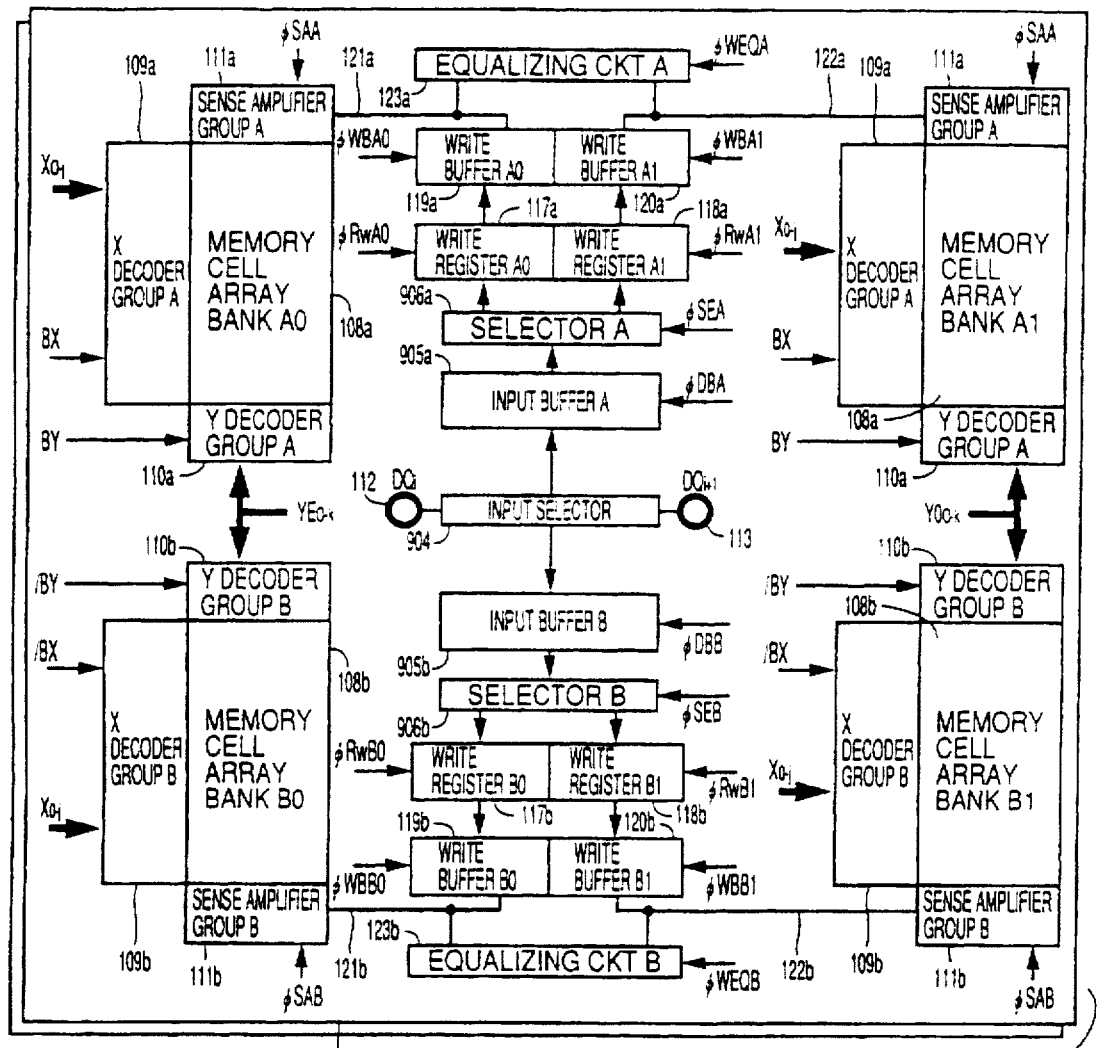
FIG. 9
FIG. 9A
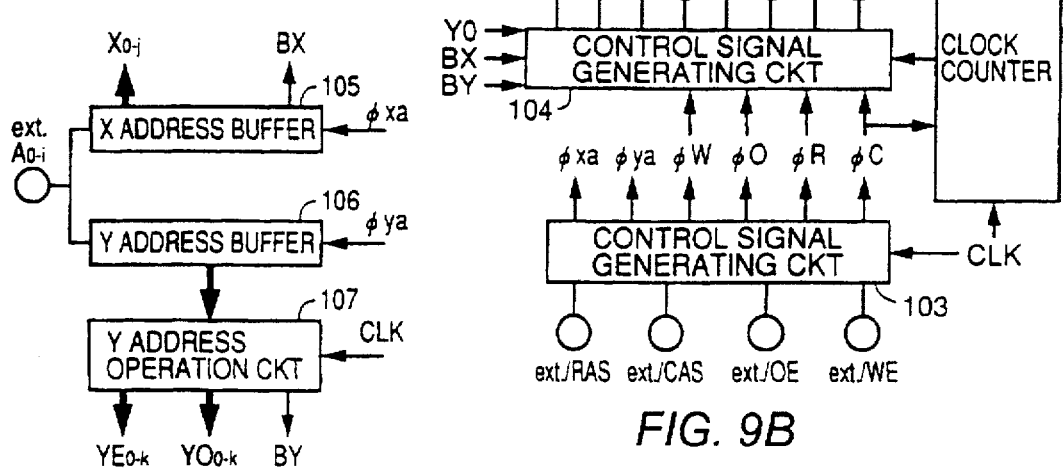
FIG. 9B

FIG.10
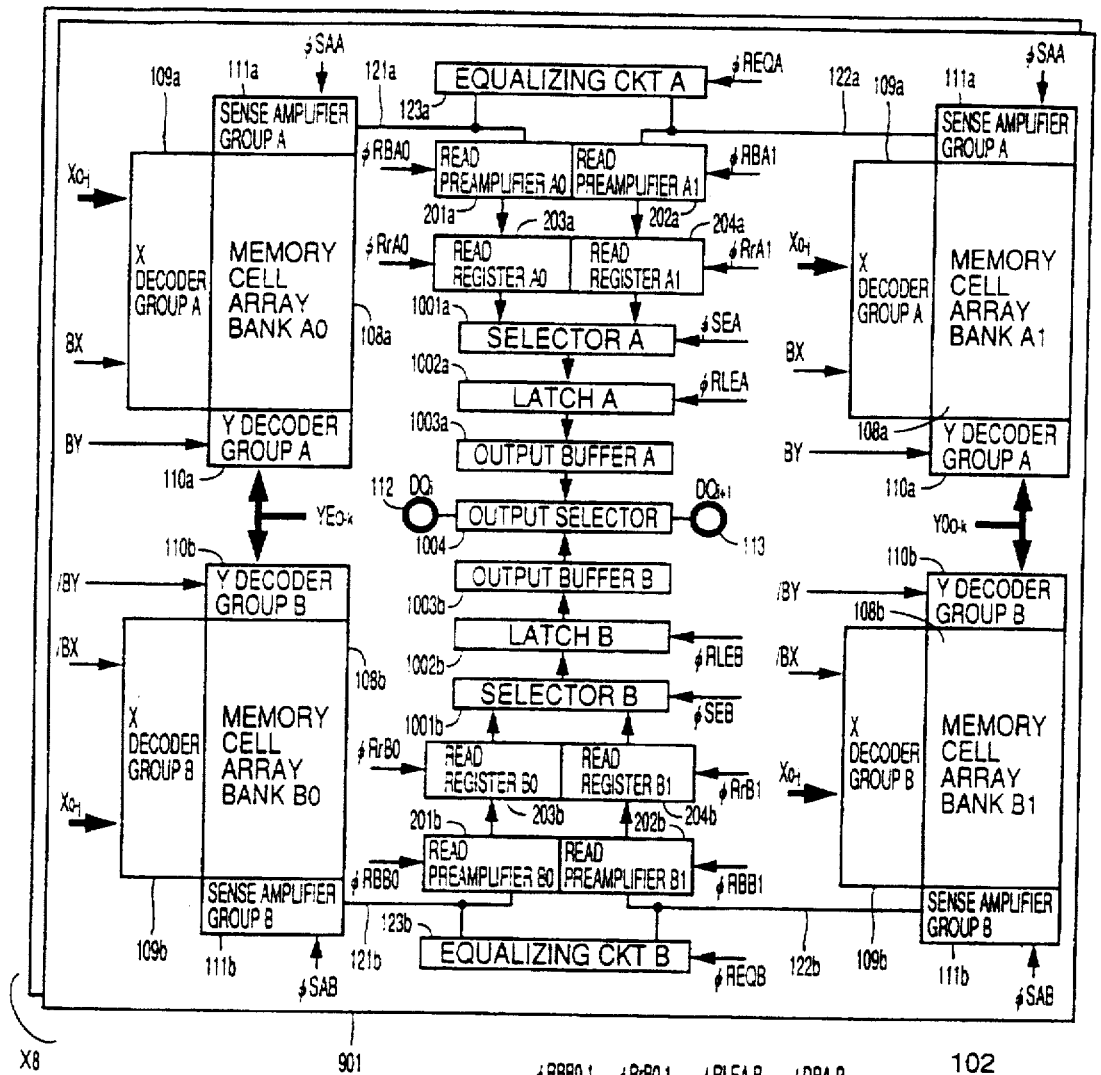
FIG. 10A
FIG. 10B
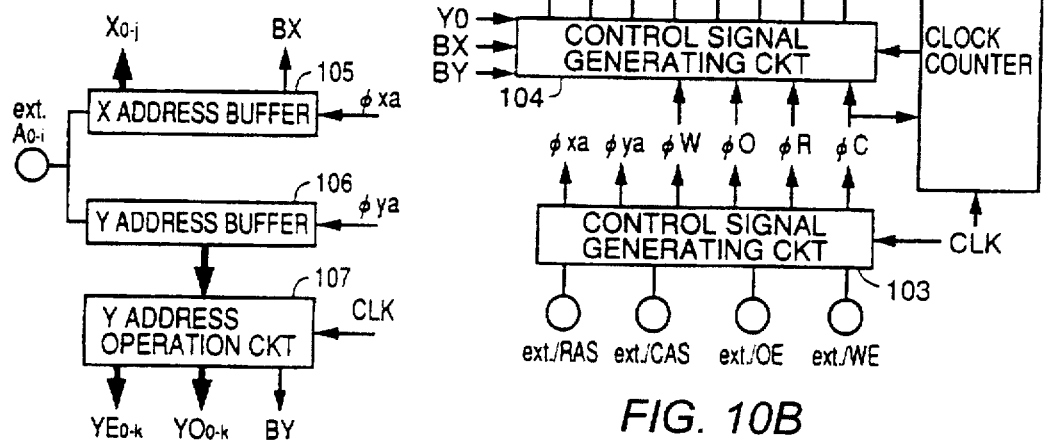

×8 CONFIGURATION (2 BANKS)

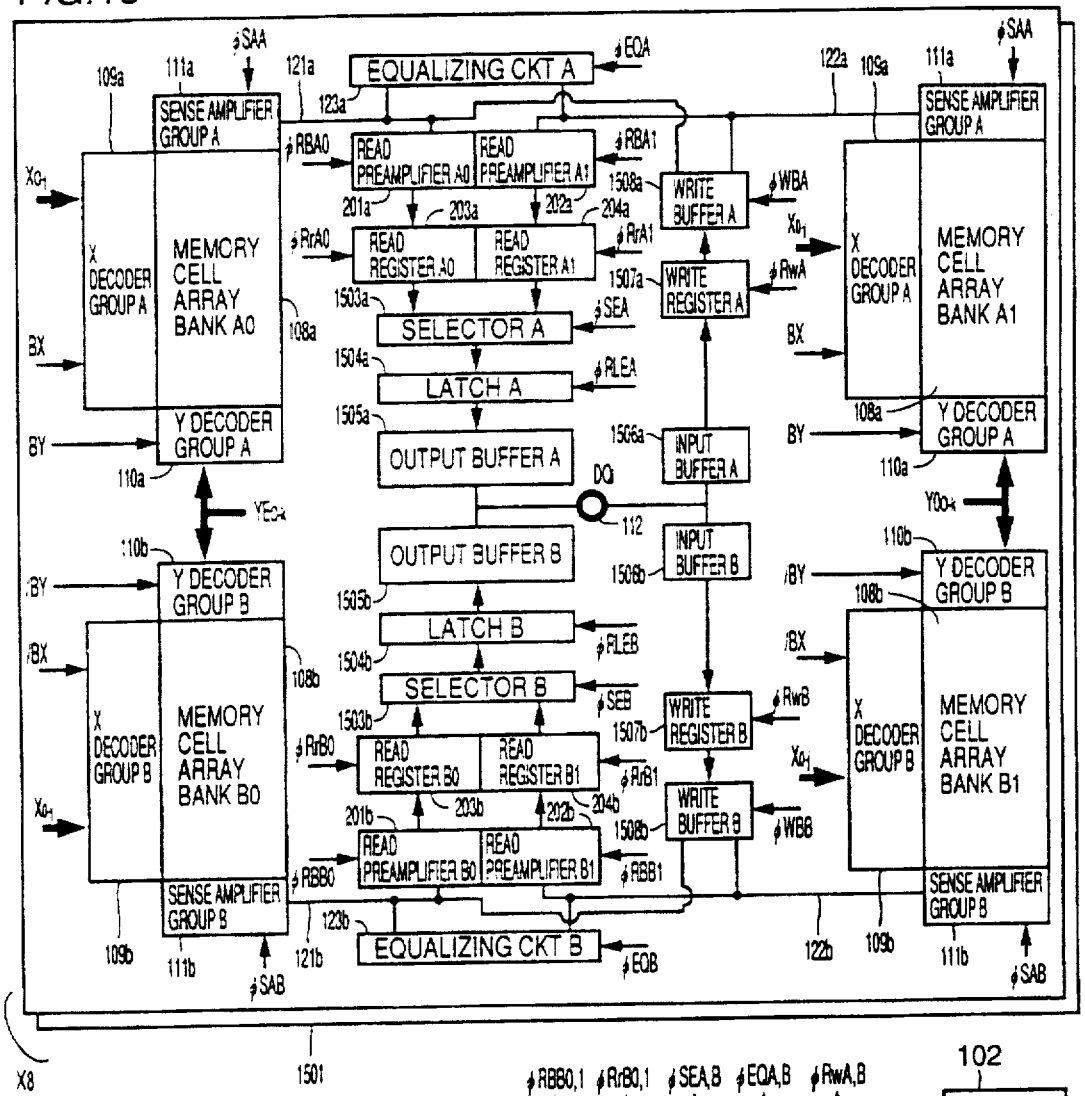
FIG. 15
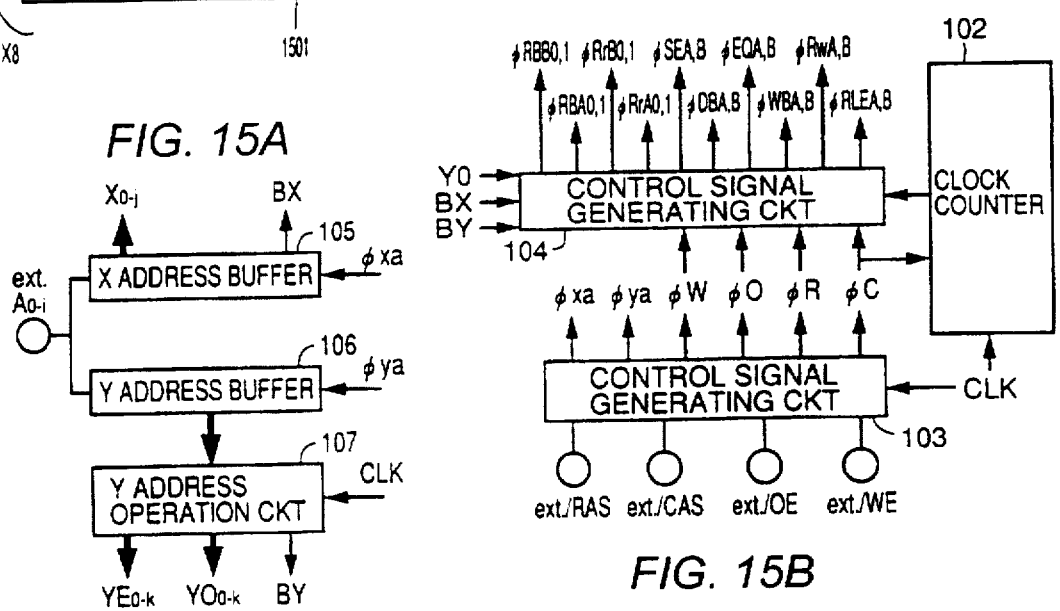
FIG. 15A
FIG. 15B

5,764,590

SYNCHRONOUS SEMICONDUCTOR MEMORY DEVICE WHICH ALLOWS SWITCHING OF BIT CONFIGURATION

BACKGROUND OF THE INVENTION

Field of the Invention

The present invention relates a synchronous semiconductor memory device and, specifically to a synchronous semiconductor memory device receiving external signals in synchronization with a clock signal applied periodically from the outside. More specifically, the present invention relates to a synchronous dynamic random access memory allowing random access.

Description of the Background Art

Though speed of operation of a dynamic random access memory (DRAM) used as a main memory has been increased, it cannot yet follow the speed of operation of a microprocessor (MPU). Accordingly, it is generally said that the overall performance of the system is limited, with the access time and the cycle time of the DRAM being the bottle neck. Recently, an SDRAM has been proposed which operates in synchronization with a clock signal, as a main memory for a high speed MPU.

In an SDRAM, 8 bits of data, for example, are continuously input/output (to and from one data input/output terminal) in synchronization with a system clock signal, for high speed access. A standard timing chart satisfying the specification of such continuous access is shown in FIG. 16. SDRAM having 8 data input/output terminals is capable of parallel input/output of 8 bits of data (bite data) DQi (i=0–7) and continuous input/output of 8 bits of data to and from one data input/output terminal, as shown in FIG. 16. Therefore, read/write of 64 (8×8) bits of data is possible in one cycle. The number of bits of the data read continuously is referred to a burst length, which can be changed by means of a mode register in the SDRAM.

As shown in FIG. 16, in the SDRAM, external signals (such as row address strobe signal/RAM, column address strobe signal /CAS and address signal Add) are received at a rising edge of an external clock signal ext. CLK, for example, which is a system clock signal.

As the address signal Add, row address signals Xa, Xc and column address signals Yb, Yd are applied time divisionally multiplexed. If the row address strobe signal /RAS is at an L (logic low) level (active) at a rising edge of external clock signal ext. CLK, the address signal Add at that time is taken as row address signals Xa and Xc. Thus, if the column address strobe signal /CAS is at the L level at the rising edge of external clock signal ext. CLK, the address signal Add at that time is taken as column address signals Yb, Yd. Row and column selecting operation in the SDRAM is performed in accordance with the taken row address signal Xa, Xc and column address signals Yb, Yd.

In data reading, after three clock cycles from the fall of column address strobe signal /CAS to the L level, the first bite data q0 is read. Thereafter, in response to the rise of external clock signal ext. CLK, bite data q1 to q7 are read successively.

Meanwhile, at the time of data writing, when column address strobe signal /CAS and write enable signal /WE are both at the L level at the rising edge of external clock signal ext. CLK, the address signal Add at that time is taken and column address signal Yd and the bite data d0 applied at that time is taken as the first write data. Thereafter, in response to the rise of external clock signal ext. CLK, bite data d1 to d7 are successively taken and successively written to the memory cells.

Different from a conventional DRAM in which address signals and data signals are taken in synchronization with address strobe signal /RAS and /CAS, in the SDRAM, address strobe signal /RAS, /CAS, address signal Add, data signal DQi and so on are taken at the rising edge of an external clock signal ext. CLK such as the system clock signal.

The advantage provided by taking the external signals in synchronization with the external clock signal is that it becomes unnecessary to ensure a margin for data input/output time taking into account the skew (offset in timing) of the address signal, and as a result, that the cycle time can be reduced. Continuous reading/writing of data in synchronization with the external clock signal enables continuous access at higher speed.

Takai et al. proposed a pipelined SDRAM in 1993 Symposium on VLSI Circuit. In the SDRAM, different from a standard DRAM, a latch circuit is provided in the middle of a critical path. One example of such a pipelined SDRAM is shown in FIG. 17.

Referring to FIG. 17, the data reading path of the SDRAM is divided into three pipelined stages. An address buffer 1702 latches and supplies to a first stage, the address signal ADD in response to a clock signal CLK1. A column decoder/latch circuit 1703 decodes, latches and supplies to a second stage, the address signal in response to a clock signal CLK2. The second stage includes a sense amplifier 1704 for amplifying data of memory cells, a preamplifier 1705 for amplifying data from sense amplifier 1704, and a main amplifier 1706 amplifying data from preamplifier 1705. A latch circuit 1707 latches and supplies to a third stage, the data from main amplifier 1706 in response to a clock signal CLK3. The third stage includes a data output buffer 1708 which amplifies data from latch circuit 1707 and outputs the same as data signal DQ. In the configuration shown in FIG. 17, the second stage is longer than the first and third stages, and hence the speed of operation of the SDRAM is defined by the second stage.

In an asynchronous DRAM, reading/writing is performed in synchronization with address strobe signal /RAD and /CAS. Therefore, in a certain read cycle, an address signal of the next read cycle cannot be received, and in a certain write cycle, an address signal and a write data of the next write cycle cannot be received. However, in the SDRAM, it is possible to receive the address signal and the like of the next cycle.

In view of the foregoing, Choi et al proposed a 2-bits prefetch SDRAM in 1993 Symposium on VLSI Circuit. FIG. 18 shows an example of the 2-bits prefetch SDRAM. Referring to FIG. 18, in the 2-bits prefetch SDRAM, the stage which defines the speed of operation is divided into two pipelines. More specifically, the first stage of the SDRAM shown in FIG. 18 is divided into one pipeline including a column decoder 1801a, a sense amplifier 1704 and a preamplifier 1802a, and another pipeline including a column decoder 1801b, a sense amplifier 1704 and a preamplifier 1802b.

In such a 2-bits prefetch SDRAM, the first and the next address signals ADD are successively latched in address buffer 1702 in response to a clock signal CLK1, the first address signal is decoded by column decoder 1801a, and data from a sense amplifier 1704 selected in accordance with the decoded signal is amplified by a preamplifier 1802a.

Latch circuit 1803a latches data from preamplifier 1802a in response to a clock signal CLK2a. Meanwhile, the next data is decoded by column decoder 1801b, and data from sense amplifier 1704 selected in accordance with the decoded signal is applied by a preamplifier 1802b. Latch circuit 1803b latches data from preamplifier 1802b in response to a clock signal CLK2b.

In the 2-bits prefetch SDRAM described above, the speed of operation becomes faster than the single pipelined SDRAM shown in FIG. 17, since the first stage is divided into two pipe lines.

Further, the 2-bits prefetch SDRAM shown in FIG. 18 may be regarded as a dual pipeline SDRAM.

FIG. 19 is a block diagram showing a specific structure of a conventional 2-bits prefetch SDRAM. In FIG. 19, only writing circuitry is shown, and reading circuitry is omitted.

As shown in FIG. 19, the SDRAM includes 8 data input/output terminals 112 and 8 functional blocks 1901 provided corresponding to data input/output terminals 112. Namely, the SDRAM has a x8 configuration, in which 8 bits of data signals are input/output in parallel in response to one address signal. Each functional block 1901 includes one memory cell array 108a, 108b divided into two banks A and B. One input buffer 905a, one selector 906a, two write registers 117a and 118a, two write buffers 119a and 120a, and two input/output line pairs 121a and 122a are provided for bank A. Meanwhile, one input buffer 905b, one selector 906b, two write registers 117b and 118b, two write buffers 119b and 120b, and two input/output line pairs 121b and 122b are provided for bank B.

Two banks A and B are selectively activated in accordance with the least significant bit of the address signal. For example, if the least significant bit of the address signal is "0" and the burst length is "4", the first 1 bit of data signal is stored in write register 117a, and the next 1 bit data signal is stored in write register 118a. When write buffer activating signal φWBA0 is activated, write buffer 119a writes data signal in write register 117a to bank A0 of memory cell array 108a through input/output line pair 121a. When write buffer activating signal φWBA1 is activated, write buffer 120a writes data signal in write register 118a to bank A1 of memory cell array 108a through input/output line pair 121a. When two bits of data are read in this manner, equalizing circuit 123a equalizes input/output line pairs 121a and 122a, respectively. Then, similarly, the third data signal is written to bank A0, and the fourth data signal is written to bank A1.

The 2-bits prefetch SDRAM-buffer comprises registers and input/output line pairs twice the number of those in a standard SDRAM. Therefore, the larger the number of bit configuration, the larger the area penalty. For example, in a 2-bits prefetch SDRAM of x16 configuration, the area penalty imposed by registers, buffers, and input/output line pairs becomes twice that of the 2-bits prefetch SDRAM of x8 configuration.

Further, the larger the number of banks, the larger the area penalty. For example, in a 2-bits prefetch SDRAM having 4 bank configuration, the area penalty imposed by the registers, buffers and input/output line pairs becomes twice that of the 2-bits prefetch SDRAM having 2 bank configuration.

SUMMARY OF THE INVENTION

Therefore, an object of the present invention is to provide an SRAM of which chip size is small.

Another object of the present invention is to provide an SDRAM of multi-bit configuration in which increase of area penalty is suppressed.

Another object of the present invention is to provide an SDRAM of multi-bank configuration in which increase of area penalty is suppressed.

According to one aspect of the present invention, the synchronous semiconductor memory device having first and second modes and receiving external signals including a control signal, an address signal and a data signal in synchronization with an external clock signal includes: first and second data input/output terminals; a memory cell array; first and second input/output line pairs; first and second write data registers; a first write switching circuit; third and fourth input/output line pairs; third and fourth write data registers; a second write switching circuit; first and second read data registers; a first read switching circuit; third and fourth read data registers; and a second read switching circuit. The memory cell array is divided into first and second banks in which activation and precharging operation are performed independent from each other. The first and second input/output line pairs are connected to the first bank. The first and second write data registers are connected to the first and second input/output line pairs, respectively, storing data signals to be written to the first bank. The first write switching circuit alternately selects the first and second write data registers in response to the external clock signal, and, applies the data signal applied from the first data input/output terminal to the selected write data register in the first mode, and in the second mode, applies the data signal applied from the first data input/output terminal to the first write data register, and applies the data signal applied from the second data input/output terminal to the second write data register. The third and fourth input/output line pairs are connected to the second bank. The third and fourth write registers are connected to the third and fourth input/output line pairs and store data signals to be written to the second bank. The second write switching circuit selects alternately the third and fourth write data register in response to the external clock signal and applies the data signal applied from the first data input/output terminal to the selected write data register in the first mode, and in the second mode, applies the data signal from the first data input/output terminal to the third write data register and applies the data signal from the second data input/output terminal to the fourth write data register. The first and second read data registers are connected to the first and second input/output line pairs, respectively, and store data signals read from the first bank. The first read switching circuit selects alternately the first and second read data registers in response to the external clock terminal, applies the data signal stored in the selected read register to the first data input/output terminal in the first mode, and in the second mode, applies the data signals stored in the first read data register to the first data input/output terminal and applies the data signal stored in the second read data register to the second data input/output terminal. The third and fourth read data registers are connected to the third and fourth input/output line pairs, respectively, and store data signal read from the second bank. The second read switching circuit selects alternately the third and fourth read data registers in response to the external clock signal and applies the data signal stored in the selected read data register to the first data input/output terminal in the first mode, and in the second mode, applies the data signal stored in the third read data register to the first data input/output terminal and applies the data signal stored in the fourth read data register to the second data input/output terminal.

Therefore, the synchronous semiconductor memory device functions as a 2-bits prefetch x1 configuration in the first mode, and functions as a 1 bit prefetch x2 configuration in the second mode.

According to another aspect of the present invention, the semiconductor memory device having first and second modes and receiving external signals including a control signal, an address signal and a data signal in synchronization with an external clock signal includes first and second data input/output terminals, a memory cell array and a switching circuit. The memory cell array is divided into first and second banks. The switching circuit connects the first data input/output terminal to the first and second banks in the first mode, and in the second mode, connects the first data input/output terminal to the first bank and the second data input/output terminal to the second bank.

Therefore, the synchronous semiconductor memory device functions as a 2 bank x1 configuration in the first mode, and functions as 1 bank (not banked) x2 configuration in the second mode.

According to still another aspect of the present invention, the synchronous semiconductor memory device having first and second modes and receiving external signals including a control signal, an address signal and a data signal in synchronization with an external clock signal includes a memory cell array, first and second input/output line pairs, first and second data reading circuits, a selecting circuit and a data writing circuit. The first and second input/output lines are connected to the memory cell array. The first and second data reading circuits are connected to the first and second input/output line pairs, respectively, and read data from the memory cell array. The selecting circuit selects alternately the first and second data reading circuits in response to the external clock signal, and externally outputs the data signal from the selected data reading circuit. The data writing circuit is connected to the first and second input/output line pairs, and writes externally input data signal to the memory cell array.

Therefore, as compared with a device employing 2-bits prefetch configuration both in reading and writing circuitry, area penalty is smaller.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1–1B are block diagrams showing a configuration of a data writing circuitry of an SDRAM in accordance with a first embodiment of the present invention.

FIGS. 2–2B are a block diagrams showing a configuration of a data reading circuitry of the SDRAM shown in FIG. 1.

FIGS. 9–9B are a block diagrams showing a configuration of a data writing circuitry of an SDRAM in accordance with a second embodiment of the present invention.

FIGS. 10–10B are a block diagrams showing a configuration of data reading circuitry of the SDRAM shown in FIG. 9.

FIGS. 15–15B are a block diagrams showing overall configuration of an SDRAM in accordance with a third embodiment of the present invention.

DESCRIPTION OF THE PREFERRED EMBODIMENTS

Figure 3:
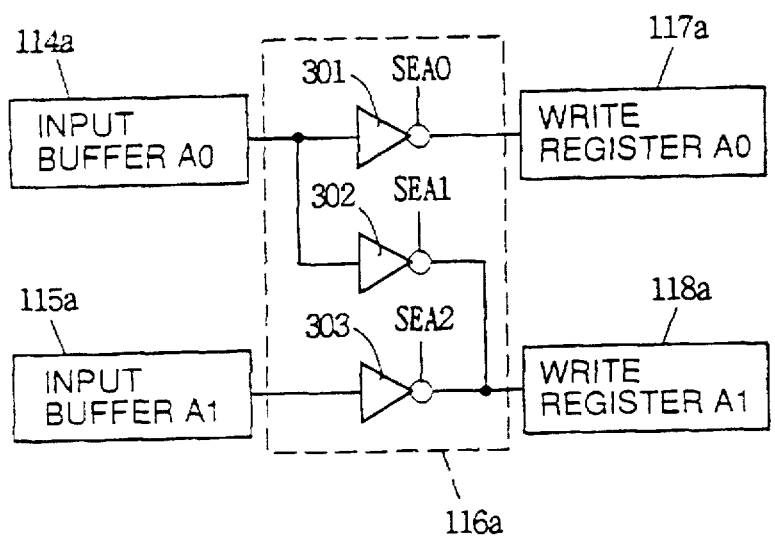
FIG. 3 shows a specific configuration of the selector shown in FIG. 1.

Embodiments of the present invention will be described in detail with reference to the figures. In the drawings, like reference characters denote like portions.

[First Embodiment]

FIGS. 1 and 2 are block diagrams showing overall configuration of an SDRAM in accordance with the first embodiment of the present invention. FIG. 1 shows a writing circuitry only, and FIG. 2 shows a reading circuitry only.

Referring to FIG. 1, the SDRAM includes 8 functional blocks 101, a clock counter 102, control signal generating circuits 103 and 104, an X address buffer 105, a Y address buffer 106 and a Y address operation circuit 107. Two data input/output terminals 112 and 113 are provided corresponding to each of the functional blocks 101, each functional block 101 includes one memory cell array 108a, 108b. This one memory cell array 108a, 108b is divided into two banks A (consisting of A0 and A1) and B (consisting of B0 and B1). Corresponding to the memory cell array 108a of bank A, an X decoder group 109a constituting a row decoder for decoding address signals X0 to Xj for selecting a corresponding row of memory cell array 108a, a Y decoder group 110a constituting a column decoder for decoding column address signals YE0 to YEk and YO0 to YOk for selecting a corresponding column of memory cell array 108a, and a sense amplifier group 111a for sensing and amplifying the data of the memory cell connected the selected row of memory cell array 198a are provided.

X decoder group 109a is activated in response to a bank designating signal BX, and Y decoder group 110a is activated in response to bank designating signal BY.

Corresponding to bank A, input/output line pairs 121a and 122a are provided for transmitting the data signal sensed and amplified by sense amplifier group 111a and for transmitting a write data signal to the selected memory cell of memory cell array 108a. Input/output line pair 121a is connected to a corresponding portion A0 of bank A, and input/output line pair 122a is connected to a corresponding portion A1 of bank A. Corresponding to input/output line pairs 121a and 122a, an equalizing circuit 123a for equalizing input/output line pairs 121a and 122a, respectively, in response to an activating signal φWEQA is provided.

Referring to FIG. 1, for data writing, there are provided input buffers 114a and 115a activated in response to an input buffer activating signal φDBA, responsive to an input data signal applied to data input/output terminals 112 and 113 for generating write data signal, respectively; a selector 116a responsive to selector control signals φSEA0 to φSEA2 for storing write data signal from an input buffer 114a through write registers 117a and 118a, which will be described later; write registers 117a and 118a activated in response to register activating signals φRwA0 and φRwA1, respectively, for storing write data signal supplied from selector 116a; and write buffers 119a and 120a activated in response to write buffer activating signals φWBA0 and φWBA1, respectively, for amplifying data signal stored in write registers 117a and 118a, respectively and for transmitting the amplified data signal to input/output line pairs 121a and 122a, respectively.

Similar to the above described banks A, for the bank B, there are provided an X decoder group 109b activated in response to a bank designating signal /BX; a Y decoder group 110b activated in response to a bank designating signal /BY; a sense amplifier group 111b activated in response to a sense amplifier activating signal φSAB; input/output line pairs 121b and 122b; an equalizing circuit 123b activated in response to an equalizing circuit activating signal φWEQB; input buffers 114b and 115b activated in response to an input buffer activating signal φDBB; a selector 116b controlled in response to selector control signals φSEB0 to φSEB2; write registers 117b and 118b activated in response to register activating signals φRwB0 and φRwB1; and write buffers 119b and 120b activated in response to write buffer activating signals φWBB0 and φWBB1, respectively.

Referring to FIG. 2, for data reading, corresponding to bank A, there are provided: read preamplifiers 201a and 202a activated in response to preamplifier activating signals φRBA0 and φRBA1, respectively, for amplifying data on input/output line pairs 121a and 122a, respectively; read registers 203a and 204a activated in response to a register activating signal for storing a data signal amplified by read preamplifiers 201a and 202a; a selector 205a controlled in response to selector control signals φSEA0 to φSEA2 for supplying data signal from read registers 203a and 204a to latch circuit 206a and 207a, which will be described later, respectively; latch circuits 206a and 207a responsive to a latch signal φRLEA for latching data signal from selecting 205a, respectively; and output buffers 208a and 209a for outputting data signals from latch circuits 206a and 207a, respectively.

Similar to bank A, for the bank B, provided are: read preamplifiers 201b and 202b activated in response to preamplifier activating signals φRBB0 and φRBB1; read registers 203b and 204b activated in response to register activating signals φRrB0 and φRrB1, respectively; a selector 205b controlled in response to selector control signals φSEB0 to φSEB2; read circuits 206b and 207b for latching data signals in response to a latch signal φRLEB; and output buffers 208b and 209b.

The reading circuitry having such a configuration is divided into three pipeline stages. In bank A, X decoder group 109a, Y decoder group 110a, sense amplifier group 111a and read preamplifiers 201a and 202a constitute a first pipeline stage. Read registers 203a and 204a constitute pipeline registers between first and second pipeline stages. Selector 205a constitutes the second pipeline stage. Latch circuits 206a and 207a constitute a pipeline register between second and third pipeline stages. Output buffers 208a and 209a constitute the third pipe line stage. Bank B is also pipelined in the similar manner as bank A.

Referring to FIGS. 1 and 2, control signal generating circuit 103 receives external control signals, that is, an external row address strobe signal ext. /RAS, an external column address strobe signal ext. /CAS, an external output enable signal ext. /OE, and an external write enable signal ext. /WE in synchronization with an external clock signal CLK which is a system clock signal, for example, and generates internal control signals φxa, φya, φW, φO, φR and φC.

Control signal generating circuit 104 generates, responsive to bank designating signals BX and BY, the least significant bit Y0 of an external address signal, internal control signals φW, φO, φR and φC and to an output from a clock counter 102, control signals for driving banks A and B independent from each other, that is, equalize activating signals φWEQA, φWEQB, φREQA and φREQB, sense amplifier activating signals φSAA and φSAB, write buffer activating signals φWBA0, φWBA1, φWBB0 and φWBB1, register activating signals φRwA0, φRwA1, φRwB0 and φRwB1, selector control signals φSEA0 to 2 and φSEB0 to 2, input buffer activating signals φDBA and φDBB, preamplifier activating signals φRBA0, φRBA1, φRBB0 and φRBB1, register activating signals φRrA0, φRrA1, φRrB0 and φRrB1, selector control signals φSEA0 to φSEA2 and φSEB0 to φSEB2, and latch signals φRLEA and φRLEB.

X address buffer 105 takes external address signals ext. A0 to ext. Ai in response to internal control signal φxa, and generates address signals X0 to Xj and a bank selection signal BX. Y address buffer 106 takes external address signals ext. A0 to ext. Ai in response to internal control signal φya and controls Y address operation circuit 107.

Y address operation circuit 107 is controlled by the external clock signal CLK, and generates column address signals YE0 to YEk and YO0 to YOk, and a bank designating signal BY.

The first embodiment is characterized in that two data input/output terminals 112 and 113 are provided corresponding to each functional block 101, that two input buffers are provided corresponding to each bank, that two output buffers are provided corresponding to each bank, and that each selector is controlled in response to three selector control signals, and the first embodiment is switchable between x8 configuration mode and x16 configuration mode.

In x8 configuration mode, eight data input/output terminals 112 are used, and in x16 configuration mode, eight data input/output terminals 113 are used in addition to eight data input/output terminals 112. Input buffers 114a and 115a are activated in response to input buffer activating signal φDDA both in the x8 configuration mode and x16 configuration mode. Therefore, in x8 configuration mode, only the input buffer 114a applies the data signals from data input/output terminal 112 to selector 116, while in x16 configuration mode, input buffer 114a applies the data signal from data input/output terminal 112 to selector 116a and input buffer 115a applies the data signal from data input/output terminal 113 to selector 116a.

Similarly, input buffers 114b and 115b are activated in response to input buffer activating signal φDDB both in the x8 configuration and x16 configuration. Therefore, in the x8 configuration mode, only the input buffer 114b applies the data signal from data input/output terminal 112 to selector 116b, and in x16 configuration mode, input buffer 114b applies the data signal from data input/output terminal 112 to selector 116b and input buffer 115b applies the data signal from data input/output terminal 113 to selector 116b.

The same applies to output buffers 208a, 209a, 208b and 209b. In order to reduce power consumption, input buffers 114a and 114b and output buffers 208a and 208b only may be activated in the x8 configuration mode.

FIG. 3 is a schematic diagram showing specific configuration of selector 116a on bank A shown in FIG. 1. Referring to FIG. 3, selector 116a includes an inverter 301 activated in response to selector control signal SEA0, an inverter 302 activated in response to selector control signal SEA1 and an inverter 303 activated in response to selector control signal SEA2. Selector 116b on bank B has similar structure.

In the x8 configuration mode, inverter 303 is always kept inactive, and inverters 301 and 3302 are activated alternately. Therefore, data signals applied from data input/output terminal 112 through input buffer 114a are applied alternately to write registers 117a and 118a.

Meanwhile, in the x16 configuration mode, inverter 302 is always kept inactive, and inverters 301 and 303 are always active. Therefore, the data signal applied from data input/output terminal 112 through input buffer 114a is applied to write register 117a, and the data signal applied from data input/output terminal 113 through input buffer 115a is applied to write register 1118a.

Figure 4:
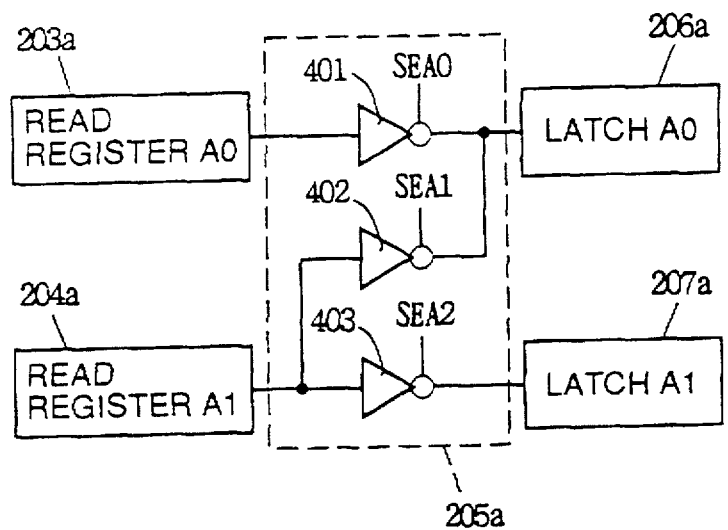
FIG. 4 shows a specific configuration of the selector shown in FIG. 2.

FIG. 4 is a schematic diagram showing a specific configuration of selector 205A on bank A shown in FIG. 2. Referring to FIG. 4, selector 205a includes an inverter 401 activated in response to selector control signal SEA0, an inverter 402 activated in response to selector control signal SEA1, and an inverter 403 activated in response to selector control signal SEA2. Selector 205b on bank B has a similar structure.

In the x8 configuration mode, inverter 403 is always kept inactive, and inverters 401 and 402 are activated alternately. Therefore, data signals in the read registers 203a and 204a are applied to data input/output terminal 112 through latch circuit 206a and output buffer 208a alternately.

Meanwhile, in the x16 configuration mode, inverter 402 is always kept inactive, while inverters 401 and 403 are always kept active. Therefore, the data signal from read register 203a is applied to data input/output terminal 112 through latch circuit 206a and output buffer 208a, and the data signal from read register 204a is applied to data input/output terminal 113 through latch circuit 207a and output buffer 209a.

Figure 5:
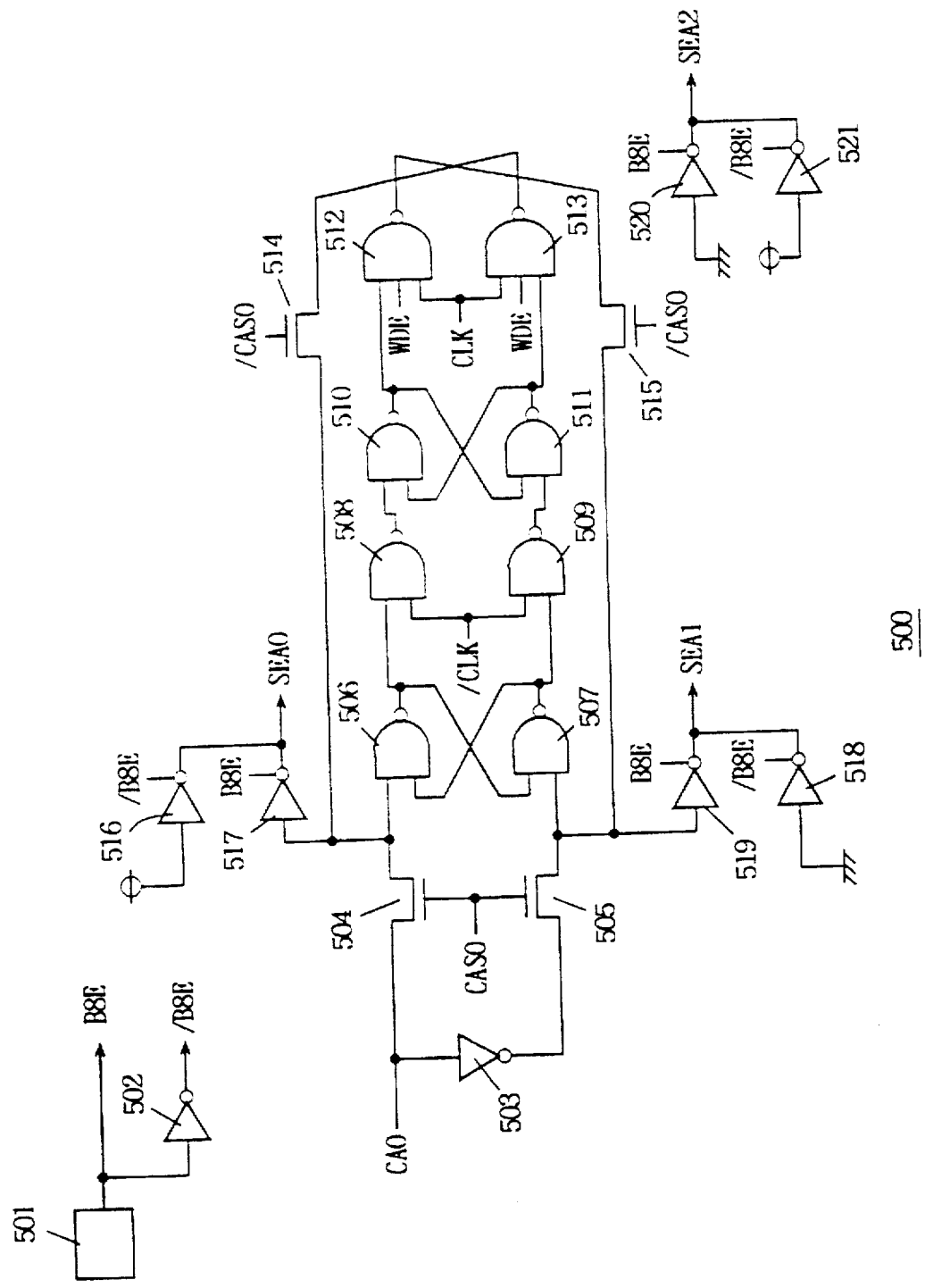
FIG. 5 shows a specific configuration of a selector control circuit for controlling the selectors of FIGS. 1 and 2.

FIG. 5 shows configuration of the selector control circuit 500 included in control signal generating circuit 104 of FIGS. 1 and 2. Selector control circuit 500 generates selector control signals SEA0 to SEA2 for controlling selectors 116a and 205a.

Referring to FIG. 5, selector control circuit 500 includes a mode setting pad 501 and an inverter 502. In the x8 configuration mode, a wire for supplying a power supply voltage is bonded to mode setting pad 501, whereby a mode setting signal B8E attains to the H (logic high) level, and a mode setting signal /B8E attains to the L level. Meanwhile, in the x16 configuration mode, a wire for supplying a ground voltage is bonded to the mode setting pad 501, whereby mode setting signal B8E attains to the L level, and mode setting signal /B8E attains to the H level.

Selector control circuit 500 further includes inverters 503 and 516 to 521, N channel MOS transistors 504, 505, 514, and 515, and NAND gates 506 to 513.

Figure 6:
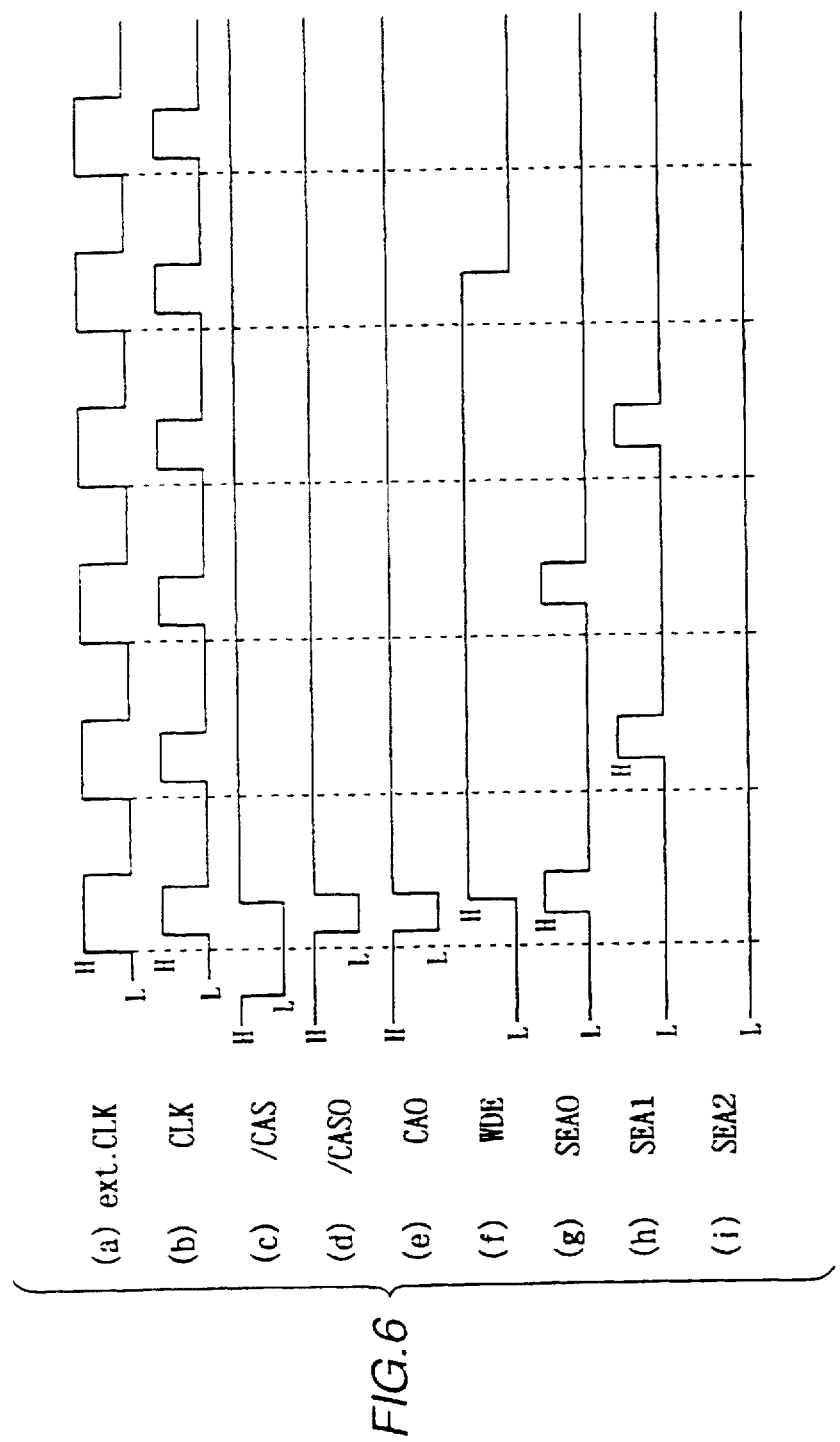
FIG. 6 is a timing chart showing the operation of the selector control circuit shown in FIG. 5.

FIG. 6 is a timing chart showing the operation of selector control circuit 500 of FIG. 5. As shown in (a) and (b) of FIG. 6, internal clock signal CLK is generated in response to external clock signal ext. CLK. As shown in (c) of FIG. 6, internal column address strobe signal /CAS0 is generated in response to external column address strobe signal /CAS. In response to internal column address strobe signal /CAS0, if the least significant bit of an externally input column address is "0", the least significant bit CA0 of the column address signal attains to the L level, as shown in (e) of FIG. 6. Write data enable signal WDE attains to the H level as shown in (f) of FIG. 6.

Therefore, the mode setting signal B8E attains to the H level and mode setting signal/B8E attains to the L level, selector control signals SEA0 and SEA1 attain to the H level alternately in response to the internal clock signal CLK, as shown in (g) and (h) of FIG. 6. Selector control signal SEA2 is also set at the L level as shown in (i) of FIG. 6.

First, setting of the SDRAM bit configuration to x8 configuration will be described. In this case, the wire for supplying the power supply voltage is bonded to mode setting pad 501 of FIG. 5. Therefore, selector control signals SEA0 and SEA1 attain to the H level alternately, and selector control signal SEA2 is always kept at the L level. Therefore, selector 116a selects write registers 117a and 118a alternately, and applies the data signal received from data input/output terminal 112 through input buffer 114a to write register 117a or 118a. Selector 116b is also selects write registers 117b and 118b alternately as selector 116a, and applies the data signal received from data input/output terminal 112 through input buffer 114b to the selected write register 117b or 118b.

Figure 7:
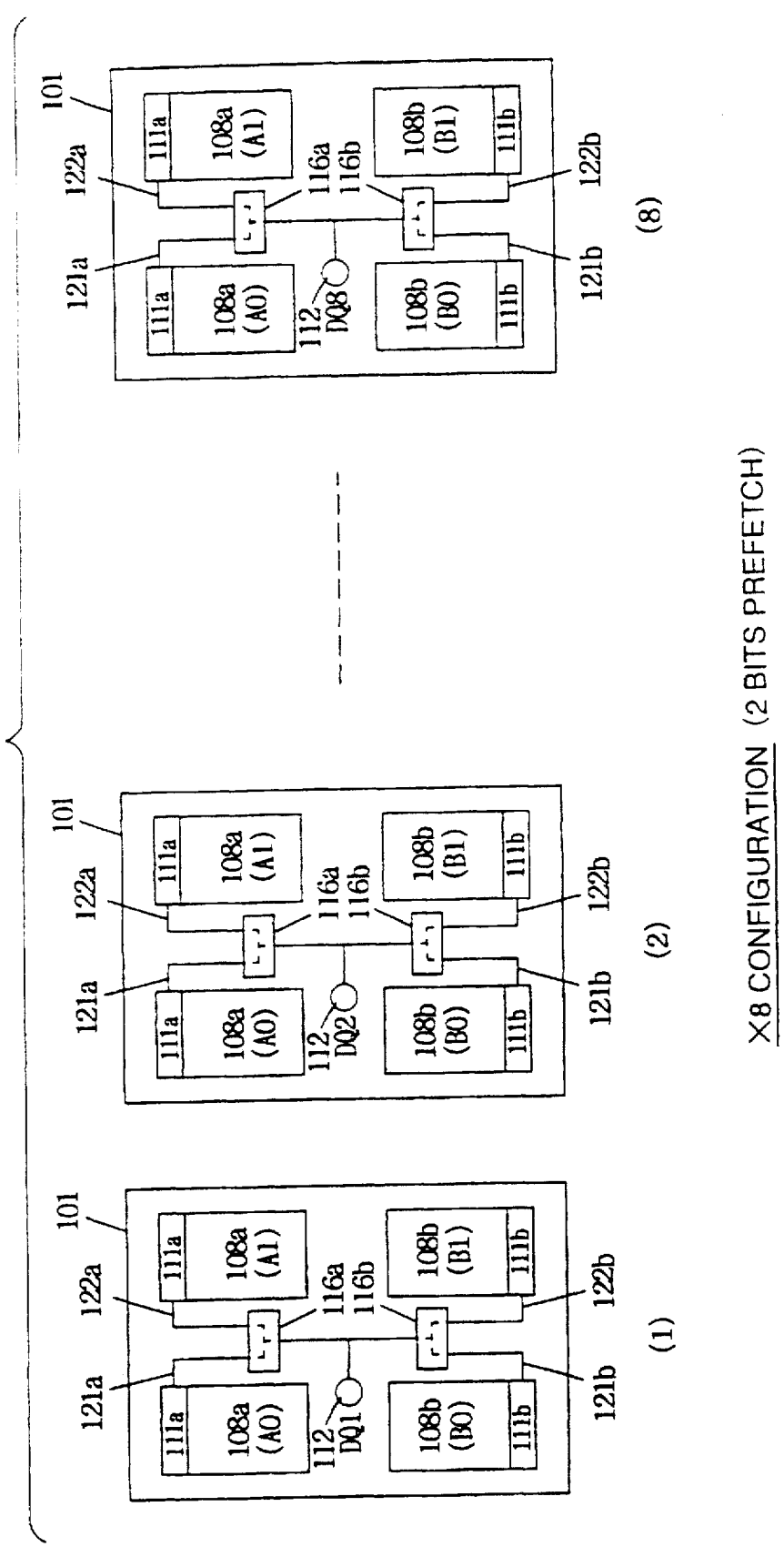
FIG. 7 is a schematic block diagram showing a configuration of a functional block when the SDRAM of FIGS. 1 and 2 is set to x8 configuration.

FIG. 7 is a schematic block diagram showing the configuration of 8 functional blocks 101 in the x8 configuration. Referring to FIG. 7, when set to the x8 configuration, the SDRAM functions as a 2-bits prefetch (dual pipeline) SDRAM. More specifically, in each functional block 101, one memory cell array 108a, 108b is divided into memory cell array 108a constituting bank A and memory cell array 108b constituting bank B. Banks A and B perform activation and precharge operation independent from each other. When bank A is designated, the first fetched data is written to the corresponding portion (upper left portion in the figure) of memory cell array 108a through the input/output line pair 121a, and the next fetched data signal is written to the corresponding portion (upper right portion in the figure) of memory cell array 108a through input/output line pair 122a. Therefore, in this case, a column address signal is generated once in two clock cycle.

The same applies to bank B. The same also applies to the reading circuitry shown in FIG. 2.

When the bit configuration of the SDRAM is to be set to x16 configuration, the wire for supplying the ground voltage is bonded to mode setting pad 521 shown in FIG. 5. Therefore, selector control signals SEA0 and SEA2 are always at the H level, and selector control signal SEA1 is always kept at the L level. Therefore, selector 116a applies the data signal received from data input/output terminal 112 through input buffer 114a to write register 117a, and applies the data signal received from data input/output terminal 113 through input buffer 115a to write register 118a. Similar to selector 116a, selector 116b applies the data signal received from data input/output terminal 112 through input buffer 114b to write register 117b, and applies the data signal received from data input/output terminal 113 through input buffer 115b to write register 118b.

Figure 8:
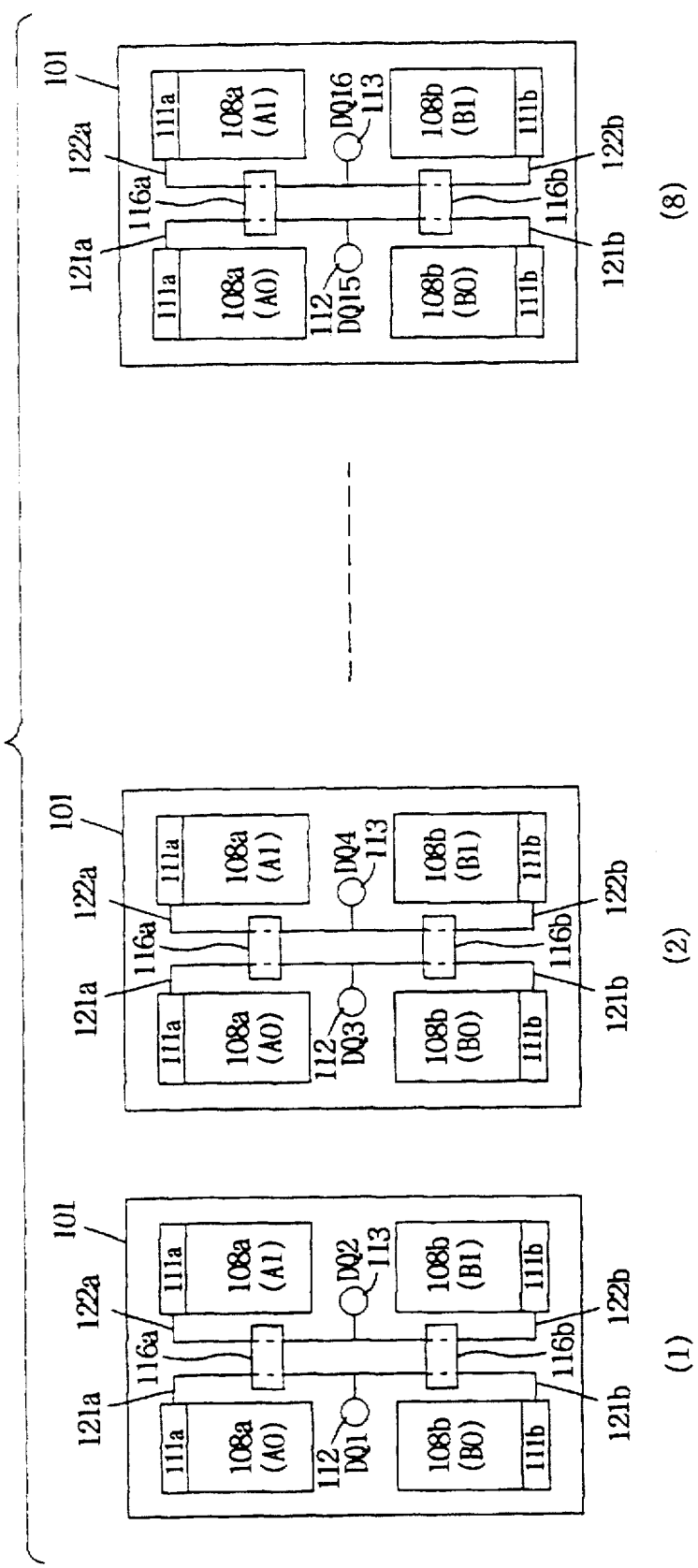
FIG. 8 is a schematic block diagram showing a configuration of a functional block when the SDRM shown in FIGS. 1 and 2 is set to x16 configuration.

Therefore, in this case, the SDRAM functions as a single pipeline (1-bit prefetch) SDRAM as shown in FIG. 8. More specifically, one memory cell array 108a, 108b is divided into memory cell array 108a constituting bank A0, memory cell array 108b constituting bank B0, memory cell array 108a constituting bank A1 and memory cell array 108b constituting bank B1. Banks A0 and B0 perform activation and the precharging operation independent from each other. Similarly, banks A1 and Bi perform activation and precharging operation independent from each other. The data signal applied from data input/output terminal 113 is written to the designated bank A0 or B0. The data signal applied from signal input/output terminal 113 is written to the designated bank A1 or B1. In this case, a column address signal is generated once in one clock cycle. The same applies to the reading circuitry shown in FIG. 2.

Figures 19, 19A, 19B:
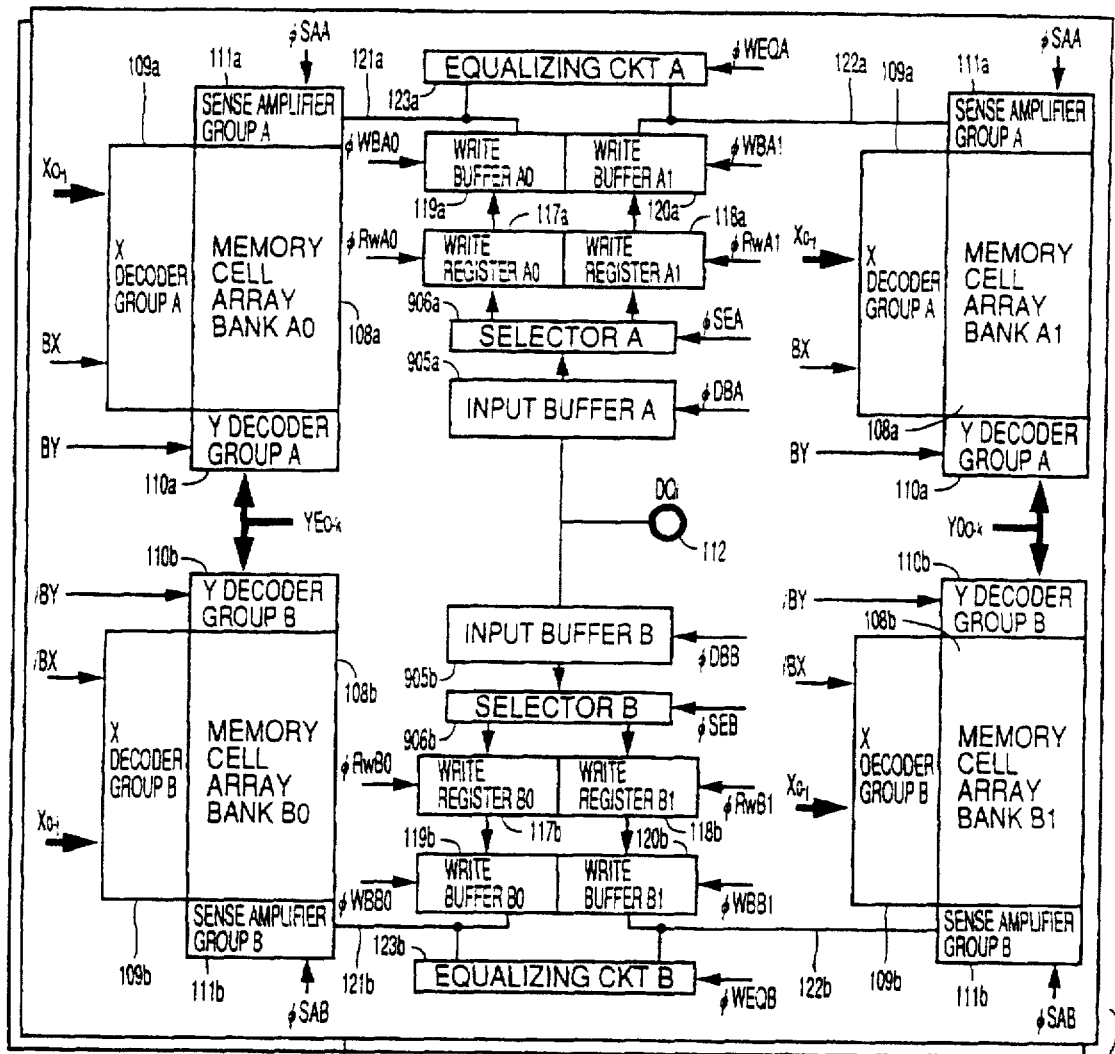
FIGS. 19–19B are a block diagrams showing another typical example of a configuration of a 2-bits prefetch SDRAM.

When the SDRAM having x16 configuration is to be provided by the conventional structure shown in FIG. 19, sixteen functional blocks 1901 are necessary. By contrast, in accordance with the first embodiment above, only eight functional blocks 101 are necessary to provide an SDRAM having the x16 configuration. Therefore, the number of write buffers, write registers, read preamplifiers and read registers can be reduced to one half that of the prior art.

Meanwhile, if the x16 configuration is to be changed to the x8 configuration using the conventional structure shown in FIG. 19, half of the write buffers and write registers are not used and wasted. By contrast, in accordance with the first embodiment above, all the write buffers, write registers, read preamplifiers and read registers are used as the device comes to have 2-bits prefetch configuration, and therefore, the elements are not at all wasted.

As described above, according to the first embodiment, the selector converts 2 bits of serial data to 2 bits of parallel data, or transmits 2 bits of parallel data as they are, in accordance with the set mode. Therefore, when set to the x8 configuration, the SDRAM functions as a 2-bits prefetch (dual pipeline) SDRAM, and when set to the x16 configuration, it functions as a single pipeline (1-bit prefetch SDRAM). Therefore, an SDRAM having small area penalty both in the x8 configuration and x16 configuration can be provided.

Though bonding option has been adopted to switch the operation mode by bonding in the above described first embodiment, master slicing may be adopted alternatively, in which modes are switched by changing masks.

Though 2-bits prefetch and single pipeline (1-bit prefetch) configurations are switched in the first embodiment, switching may be between 4-bits prefetch and 2-bits prefetch or between 8-bit prefetch and 2-bits prefetch.

[Second Embodiment]

FIGS. 9 and 10 are block diagrams showing overall configurations of the SDRAM in accordance with the second embodiment of the present invention. FIG. 9 shows data writing circuitry and FIG. 10 shows data reading circuitry.

In addition to the conventional structure shown in FIG. 19, the SDRAM includes, as shown in FIG. 9, an input selector 904 for selectively supplying data signals from data input/output terminals 112 and 113 to input buffers 905a and 905b; and as shown in FIG. 10, an output selector 1004 for selectively supplying data signals from output buffers 1003a and 1003b to data input/output terminals 112 and 113. Selector 906a selects write registers 117a and 118a in response to selector control signal φSEA, and applies the data signal received from input buffer 905a to the selected write register 117a or 118a. Selector 906b operates in the same manner as selector 906a. Selector 1001a selects read registers 203a and 204a in response to selector control signal φSEA, and applies the data signal from the selected read register 203a or 204a to output selector 1004 through latch circuit 1002a and output buffer 1003a. Selector 1001b operates in the same manner as selector 1001a.

Figure 11:
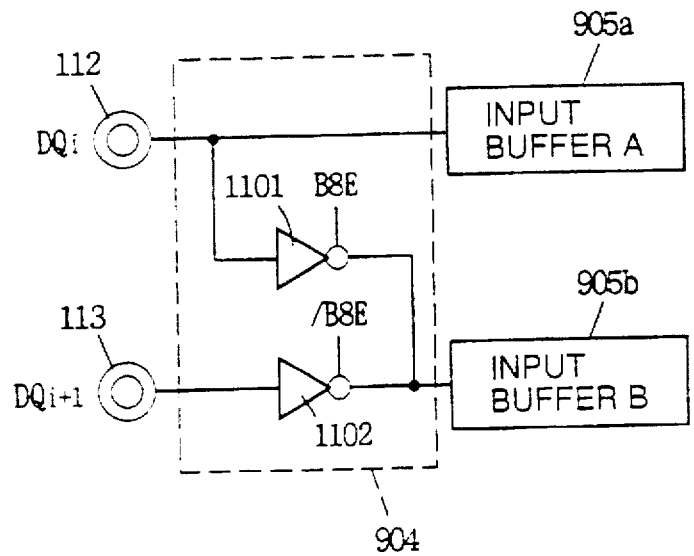
FIG. 11 shows a specific configuration of the selector shown in FIG. 9.

FIG. 11 shows a specific configuration of input selector 904 shown in FIG. 9. Referring to FIG. 11, input selector 904 includes an inverter 1101 activated in response to mode setting signal B8E, and an inverter 1102 activated in response to mode setting signal /B8E. Logic levels of mode setting signals B8E and /B8E are determined by bonding option as shown in FIG. 5. When x8 configuration mode is set, mode setting signal B8E is set to H level and mode setting signal /B8E is set to the L level. Therefore, the data signal DQi from data input/output terminal 112 is applied to input buffers 905a and 905b, while data signal DQi+1 from data input/output terminal 113 is not applied to input buffer 905b. By contrast, when the x16 configuration mode is set, mode setting signal B8E attains to the L level and the mode setting signal /B8E attains to the H level. Therefore, the data signal DQi from data input/output terminal 112 is applied to input buffer 905a, data signal DQi+1 from data input/output terminal 113 is applied to input buffer 905b, while the data signal DQi from data input/output terminal 112 is not applied to input buffer 905b.

Figure 12:
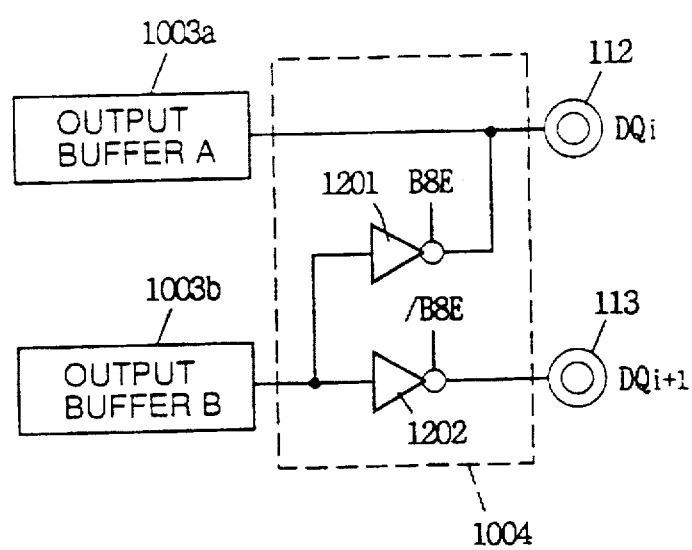
FIG. 12 shows a specific configuration of the selector shown in FIG. 10.

FIG. 12 shows a specific configuration of output selector 1004 shown in FIG. 15. Referring to FIG. 12, output selector 1004 includes an inverter 1201 activated in response to mode setting signal B8E and an inverter 1202 activated in response to mode setting signal /B8E. When the x8 configuration mode is set, mode setting signal B8E attains to the H level and mode setting signal /B8E attains to the L level. Therefore, data signals from output buffers 1003a and 1003b are applied to data input/output terminal 112, while the data signal from output buffer 1003b is not applied to data input/output terminal 113. Meanwhile, when the x16 configuration mode is set, mode setting signal B8E attains to the L level and mode setting signal /B8E attains to the H level. Therefore, data signal from output buffer 1003a is applied to data input/output terminal 112 and data signal from output buffer 1003b is applied to data input/output terminal 113, while the data signal from output buffer 1003b is not applied to data input/output terminal 112.

First, when the bit configuration of the SDRAM is to be set to x8 configuration, only the data signal from data input/output terminal 112 is applied by input selector 904 to input buffers 905a and 905b, and output selector 1004 applies the data signals from output buffers 1003a and 1003b only to data input/output terminal 112.

Figure 13:
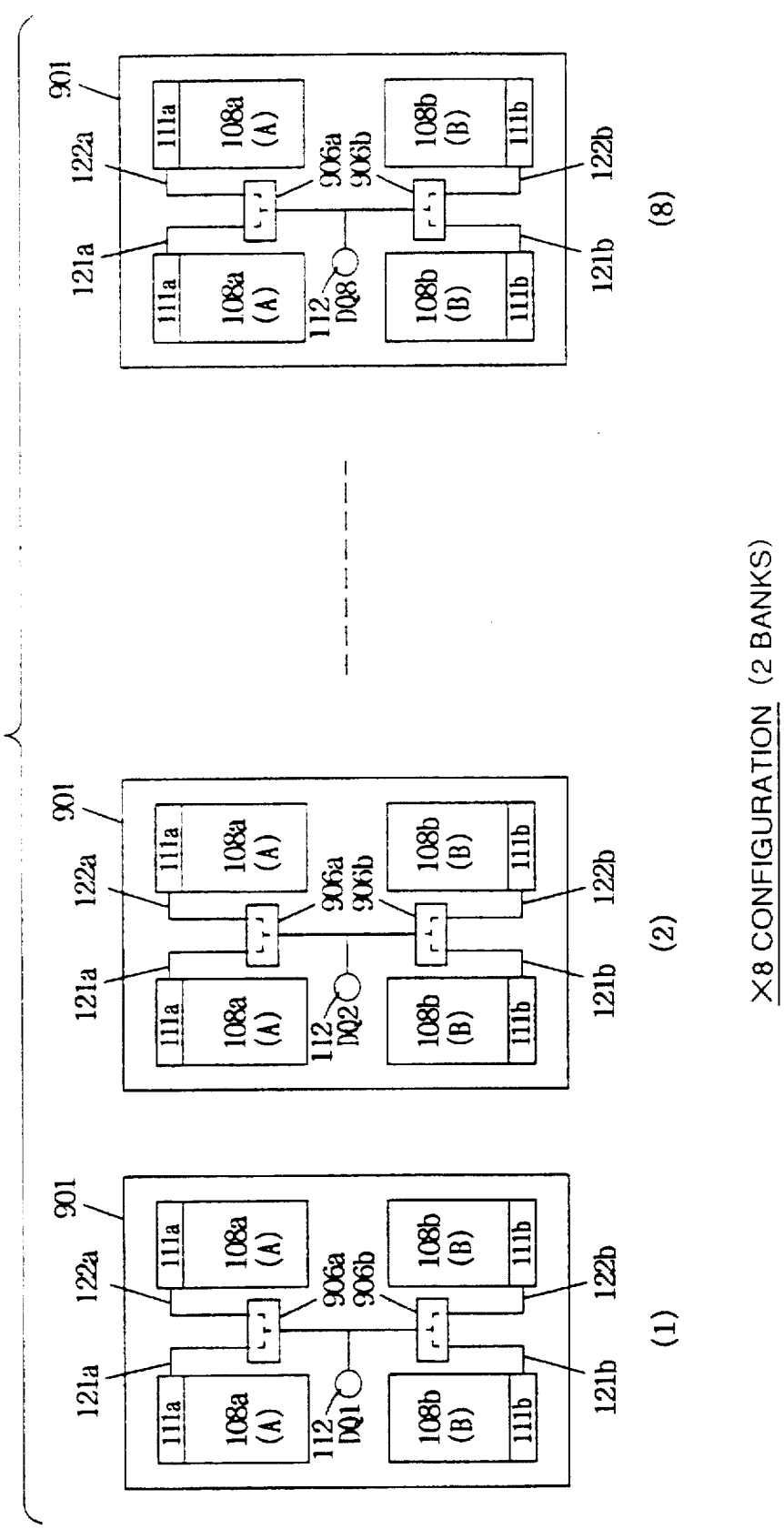
FIG. 13 is a schematic block diagram showing a configuration of a functional block when the SDRAM of FIGS. 9 and 10 is set to x8 configuration.

FIG. 13 is a schematic block diagram showing the configuration of 8 functional blocks 901 in the SDRAM when it is set to have x8 configuration. Referring to FIG. 13, in each functional block 901, one memory cell array 108a, 108b is divided into memory cell array 108a constituting bank A and memory cell array 108b constituting bank B. Banks A and B perform activation and precharging operation independent from each other. When bank A is designated, the data signal first fetched through data input/output terminal 112 is written to the corresponding portion A0 of memory cell array 108a through input/output line pair 121a, and the next fetched data signal is written to the corresponding portion A1 of memory cell array 108a through input/output line pair 122a. Operation in bank B is similar to that of bank A.

Therefore, each functional block 901 has 2-bank configuration, each bank being 2-bits prefetch type. The configuration in the data reading circuitry shown in FIG. is similar to the data writing circuitry described above.

When the bit configuration of the SDRAM is set to x16 configuration, input selector 904 applies the data signal from data input/output terminal 112 to input buffer 905a and applies the data signal from data input/output terminal 113 to input buffer 905b, while output selector 1004 applies the data signal from output buffer 1003a to data input/output terminal 112 and applies the data signal from output buffer 1003b to data input/output terminal 113.

Figure 14:
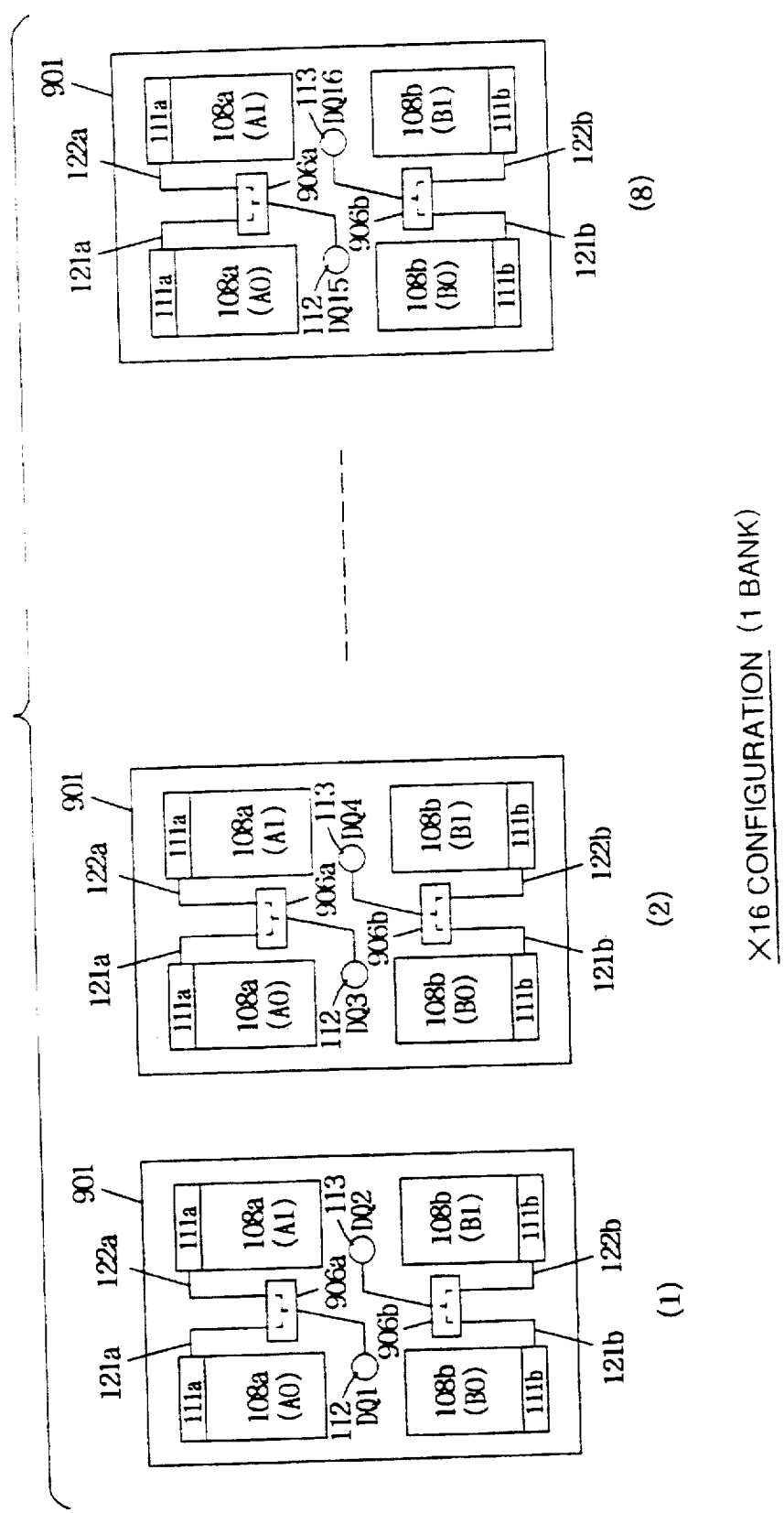
FIG. 14 is a schematic block diagram showing a configuration of a functional block when the SDRAM of FIGS. 9 and 10 is set to x16 configuration.
Figure 16:
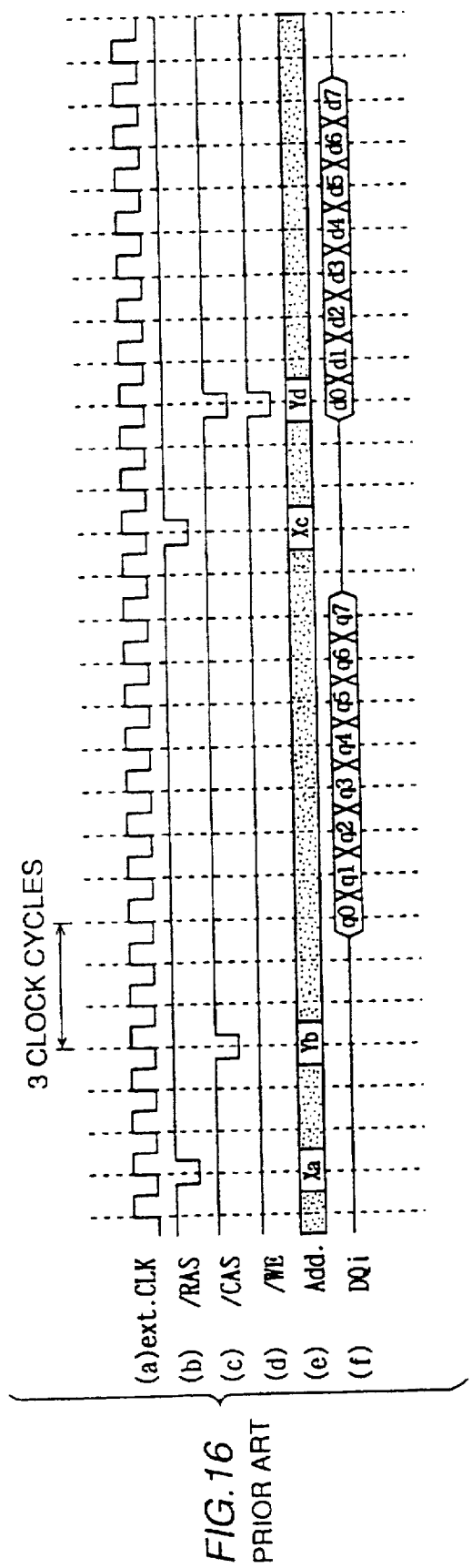
FIG. 16 is a timing chart showing typical operation of an SDRAM.
Figure 17:
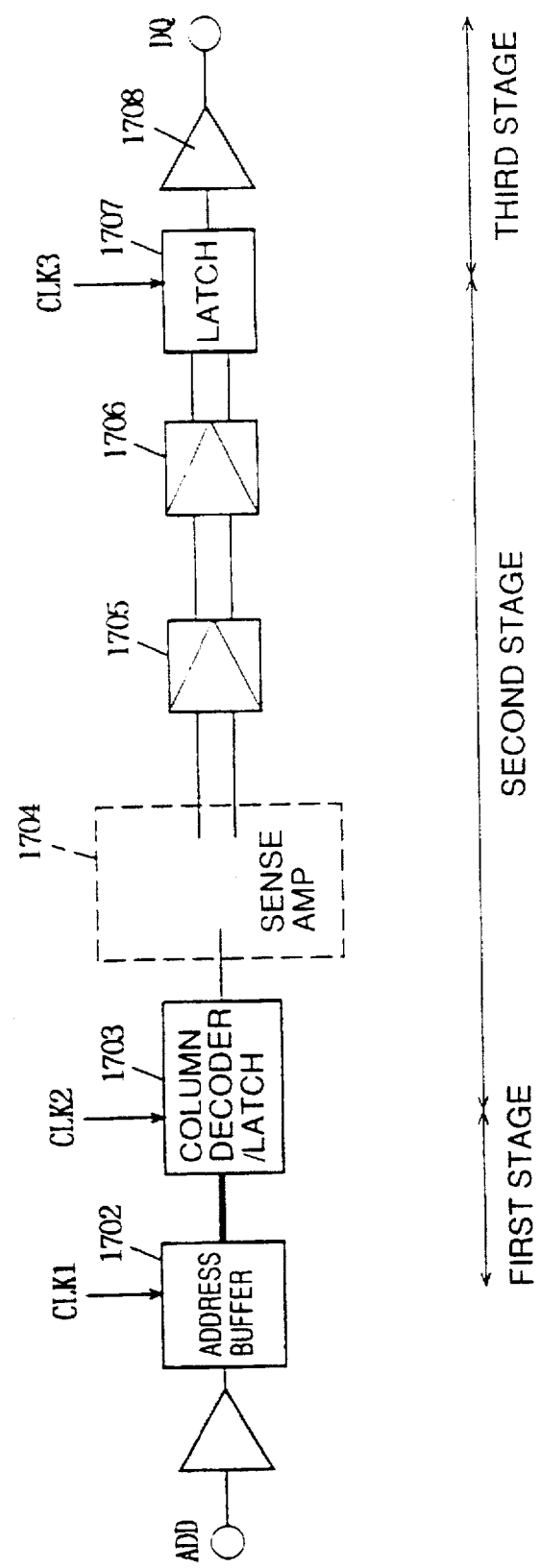
FIG. 17 is a block diagram showing a typical example of a configuration of a single pipeline SDRAM.
Figure 18:
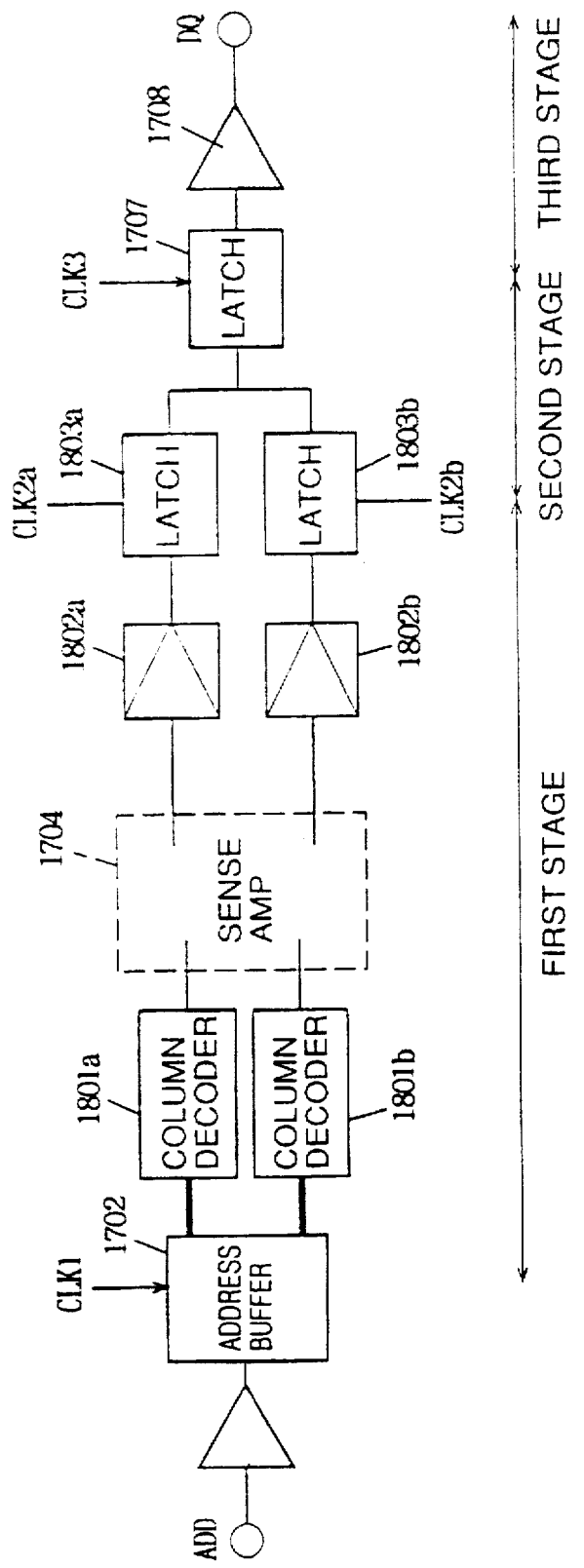
FIG. 18 is a block diagram showing a typical example of a configuration of a 2-bits prefetch SDRAM.

FIG. 14 is a schematic block diagram showing the configuration of 8 functional blocks 901 in the x16 configuration. Referring to FIG. 14, in the x16 configuration, in each functional block 901, the data signal first fetched from data input/output terminal 112 is written to the corresponding portion A0 of memory cell array 108a, and the next fetched data signal is written to the corresponding portion A1 of memory cell array 108a. On the other hand, the data signal first fetched from data input/output terminal 113 is written to the corresponding portion B0 of memory cell array 108b, and the next fetched data signal is written to the corresponding portion B1 of memory cell array 108b. Therefore, memory cell arrays 108a and 108b perform activation simultaneously and perform precharge operation simultaneously. Namely the SDRAM functions as a 2-bits prefetch SDRAM with each bit corresponding to 1 bank.

When the SDRAM is to be set to x16 configuration by using the conventional structure shown in FIG. 19, sixteen functional blocks 1901 are necessary. By contrast, according to the second embodiment, only eight functional blocks 901 are necessary. Therefore, the number of write buffers, write registers, read preamplifiers and read registers can be reduced to one half that of the prior art.

Meanwhile, when x16 configuration is to be changed to x8 configuration by using the conventional structure shown in FIG. 19, only eight functional blocks 1901 may be used. However, half the write buffers, write registers, read preamplifiers and read registers are not used and wasted. By contrast, according to the second embodiment, all the write buffers, write registers, read preamplifiers and read registers are used and not at all wasted.

As described above, according to the second embodiment, input selector 904 selectively connects data input/output terminals 112 and 113 to input buffer 905a and 905b and output selector 1004 selectively connects output buffers 1003a and 1003b to data input/output terminals 112 and 113, according to the set mode. Therefore, when set to the x8 configuration, the SDRAM comes to have 2 bank configuration and in x16 configuration, it has 1 bank configuration. Consequently, area penalty is not increased no matter whether it takes x8 configuration or x16 configuration.

Though bonding option has been adopted in the above described second embodiment, master slice may be adopted alternatively. Though each bank has 2-bits prefetch type configuration in the second embodiment, it may be single pipeline (1-bit prefetch) configuration. In that case, selectors 906a, 906b, 1001a and 1001b of FIGS. 9 and 10 are not necessary, and only one input/output line pair, one write buffer, one write register, one read preamplifier and one read register may be provided.

[Third Embodiment]

FIG. 15 is a block diagram showing an overall configuration of the SDRAM in accordance with the third embodiment of the present invention. As shown in FIG. 15, the data reading circuitry has 2-bits prefetch configuration and the data writing circuitry has the single pipeline configuration. More specifically, each functional block 1501 includes a selector 1503a for selecting read registers 203a and 204a and for applying the data signal of the selected read register 203a or 204a to data input/output terminal 112 through latch circuit 10004a and output buffer 1505a, corresponding to bank A. Further, it includes a selector 1503b for selecting read registers 203b and 204b and for applying the data signal of the selected read register 203b or 204b to data input/output terminal 112 through latch circuit 1504b and output buffer 1505b, corresponding to bank B.

On bank A, the data signals from data input/output terminal 112 is written to memory cell array 108a through input buffer 1506a, write register 1507a, write buffer 1508a and input/output line pairs 121a, 122a. Meanwhile, on bank B, the data signal from data input/output terminal 112 is written to memory cell array 108b through input buffer 1506b, write register 1507b, write buffer 1508b and input/output line pairs 121b and 122b.

Here, if the data writing circuitry is adopted to have 2-bits prefetch configuration and the data reading circuitry is adopted to have single pipeline configuration, the operational frequency of the SDRAM cannot be increased. The reason for this is that the input/output line pairs 121a, 122a, 121b and 122b having large parasitic capacitances must be driven by sense amplifier groups 111a and 111b having small drivability, while the sense amplifier groups 111a and 111b operate in each clock cycle in the single pipeline configuration. By contrast, drivability of write buffers 1508a and 1508b is higher than that of sense amplifier groups 111a and 111b. Therefore, when the data writing circuitry is adopted to have the single pipeline configuration as in the third embodiment, the operational frequency is not decreased.

As described above, according to the third embodiment, the data reading circuitry has 2-bits prefetch configuration and the data writing circuitry has the single pipeline configuration. Therefore, as compared with an example in which those have 2-bits prefetch configurations, area penalty is smaller. Further, the data writing circuitry of single pipeline configuration includes write buffers 1508a and 1508b having higher drivability than sense amplifier groups 111a and 111b. Therefore, as compared with the example in which those have 2-bits prefetch configuration, it is not necessary to significantly decrease the operational frequency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device having first and second modes and receiving external signals including a control signal, an address signal and a data signal in synchronization with an external clock signal, comprising:

first and second data input/output terminals;

a memory cell array;

first and second input/output line pairs connected to said memory cell array; and switching means for alternately selecting said first and second input/output line pairs in response to said external clock signal and connecting said first data input/output terminal to the selected input/output line pair in said first mode, and for connecting said first data input/output terminal to said first input/output line pair and connecting said second data input/output terminal to said second input/output line pair in said second mode.

2. A synchronous semiconductor memory device having first and second modes and receiving external signals including a control signal, an address signal and a data signal in synchronization with an external clock signal, comprising:

first and second data input/output terminals;

a memory cell array divided into first and second banks in which activation and precharging operation are performed independent from each other;

first and second input/output line pairs connected to said first bank;

first and second write data registers connected to said first and second input/output line pairs for storing a data signal to be written to said first bank;

first write switching means for alternately selecting said first and second write data registers in response to said external clock signal and for applying the data signal from said first data input/output terminal to the selected write data register in said first mode, and for applying the data signal from said first data input/output terminal to said first write data register and applying the data signal from said second data input/output terminal to said second write data register in said second mode;

third and fourth input/output line pairs connected to said second bank;

third and fourth write data registers connected to said third and fourth input/output line pairs for storing a data signal to be written to said second bank;

second write switching means for alternately selecting said third and forth write data registers in response to said external clock signal and for applying the data signal from said first data input/output terminal to the selected write data register in said first mode, and for applying the data signal from said first data input/output terminal to said third write data register and applying the data signal from said second data input/output terminal to said forth write data register in said second mode;

first and second read data registers connected to said first and second input/output line pairs for storing the data signal read from said first bank;

first read switching means for alternately selecting said first and second read data registers in response to said external clock signal and applying the data signal stored in the selected read data register to said first data input/output terminal in said first mode, and for applying the data signal stored in said first read data register to said first data input/output terminal and applying the data signal stored in said second read data register to said second data input/output terminal in said second mode;

third and fourth read data registers connected to said third and fourth input/output line pairs for storing the data signal read from said second bank;

second read switching means for alternately selecting said third and fourth read data registers in response to said external clock signal and for applying the data signal stored in the selected read data register to said first data input/output terminal in said first mode, and for applying the data signal stored in said third read data register to said first data input/output terminal, and applying the data signal stored in said fourth read data register to said second data input/output terminal in said second mode.

3. The synchronous semiconductor memory device according to claim 2, further comprising mode setting means allowing setting of said first and second modes, for controlling said switching means in response to the set mode.

4. A synchronous semiconductor memory device having first and second modes and receiving external signals including a control signal, an address signal and a data signal in synchronization with an external clock signal, comprising:

first and second data input/output terminals;

a memory cell array divided into first and second banks; and switching means for connecting said first data input/output terminal to said first and second banks in said first mode, and said first data input/output terminal to said first bank and said second data input/output terminal to said second bank in said second mode.

5. The synchronous semiconductor memory device according to claim 4, further comprising:

first and second input/output line pairs connected to said first bank;

first selecting means responsive to said external clock signal for alternately selecting said first and second input/output line pairs;

third and fourth input/output line pairs connected to said second bank;

second selecting means responsive to said external clock signal for alternately selecting said third and fourth input/output line pairs; wherein said switching means connects said first data input/output terminal to said first and second selecting means in said first mode, and connects said first data input/output terminal to said first selecting means and said second data input/output terminal to said second selecting means in said second mode, said first selecting means connects the data input/output terminals connected by said switching means to the selected input/output line pair, and said second selecting means connects the data input/output terminal connected by said switching means to the selected input/output line pairs.

6. The synchronous semiconductor memory device according to claim 4, further comprising mode setting means allowing setting of said first and second modes for controlling said switching means in response to the set mode.

7. A synchronous semiconductor memory device having first and second modes and receiving external signals including a control signal, an address signal and a data signal in synchronization with an external clock signal, comprising:

a memory cell array;

first and second input/output line pairs connected to said memory cell array;

first and second data reading means connected to said first and second input/output line pairs respectively, for reading a data signal from said memory cell array;

selecting means responsive to said external clock signal for alternately selecting said first and second data reading means, for externally outputting the data signal from the selected data reading means; and data writing means connected to said first and second input/output line pairs for writing externally input data signal to said memory cell array.

8. The synchronous semiconductor memory device according to claim 7, wherein each of said first and second data reading means includes a sense amplifier for amplifying the data signal from said memory cell array with a first drivablity, and said data writing means includes a write buffer for amplifying said input data signal with a second drivability higher than said first drivability.

* * * * *